(12) United States Patent
Jang et al.

(10) Patent No.: US 10,886,350 B2
(45) Date of Patent: Jan. 5, 2021

(54) ELECTROLUMINESCENT DEVICE

(71) Applicant: LG Display Co., Ltd., Seoul (KR)

(72) Inventors: Ji-Hyang Jang, Paju-si (KR);
Won-Hoe Koo, Paju-si (KR);
Min-Geun Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/134,193

(22) Filed: Sep. 18, 2018

(65) Prior Publication Data

US 2019/0096976 A1 Mar. 28, 2019

(30) Foreign Application Priority Data

Sep. 27, 2017 (KR) .................. 10-2017-0124972

(51) Int. Cl.
*H01L 27/32* (2006.01)
*H01L 51/50* (2006.01)
(Continued)

(52) U.S. Cl.
CPC ........ *H01L 27/3262* (2013.01); *H01L 27/156* (2013.01); *H01L 27/322* (2013.01);
(Continued)

(58) Field of Classification Search
CPC ............ H01L 27/3262; H01L 27/3258; H01L 51/5225; H01L 51/5209; H01L 51/504;
(Continued)

(56) References Cited

U.S. PATENT DOCUMENTS

2008/0024402 A1  1/2008  Nishikawa et al.
2009/0206733 A1*  8/2009  Hwang ............... H01L 51/5265
                                           313/504
(Continued)

FOREIGN PATENT DOCUMENTS

GB            2 544 900 A       5/2017
KR      10-2016-0029491 A       3/2016

OTHER PUBLICATIONS

Extended European Search Report issued in corresponding Application No. 18192625.4, dated Mar. 1, 2019.

*Primary Examiner* — Cuong B Nguyen
(74) *Attorney, Agent, or Firm* — Morgan, Lewis & Bockius LLP

(57) ABSTRACT

An electroluminescent device includes a substrate which has a subpixel including a main subpixel and an auxiliary subpixel; a first thin film transistor and a second thin film transistor disposed on the substrate, the first thin film transistor corresponding to the main subpixel and the second thin film transistor corresponding to the auxiliary subpixel; an overcoat layer on the first and second thin film transistors; a first bottom electrode and a second bottom electrode on the overcoat layer, the first bottom electrode corresponding to the main subpixel and the second bottom electrode corresponding to the auxiliary subpixel; a light-emitting layer on the first bottom electrode and the second bottom electrode; and a top electrode on the light-emitting layer, wherein the main subpixel and the auxiliary subpixel have different color temperatures.

13 Claims, 19 Drawing Sheets

(51) Int. Cl.
  *H01L 51/52* (2006.01)
  *H01L 33/52* (2010.01)
  *H01L 33/06* (2010.01)
  *H01L 27/15* (2006.01)
  *H01L 33/58* (2010.01)

(52) U.S. Cl.
  CPC ...... *H01L 27/3246* (2013.01); *H01L 27/3258* (2013.01); *H01L 33/06* (2013.01); *H01L 33/52* (2013.01); *H01L 33/58* (2013.01); *H01L 51/504* (2013.01); *H01L 51/5206* (2013.01); *H01L 51/5209* (2013.01); *H01L 51/5221* (2013.01); *H01L 51/5225* (2013.01); *H01L 51/5237* (2013.01); *H01L 51/5275* (2013.01); *H01L 27/3206* (2013.01); *H01L 27/3213* (2013.01); *H01L 27/3216* (2013.01); *H01L 27/3218* (2013.01); *H01L 51/5262* (2013.01)

(58) Field of Classification Search
  CPC ............. H01L 51/5206; H01L 51/5221; H01L 51/5275; H01L 33/52; H01L 27/322; H01L 27/3246; H01L 33/06; H01L 27/156; H01L 33/58
  See application file for complete search history.

(56) References Cited

U.S. PATENT DOCUMENTS

| | | | |
|---|---|---|---|
| 2010/0060148 A1* | 3/2010 | Hwang | ............... H01L 51/5268 313/504 |
| 2014/0306241 A1 | 10/2014 | Hirakata et al. | |
| 2017/0005286 A1 | 1/2017 | Yun et al. | |
| 2017/0125489 A1 | 5/2017 | Jang et al. | |
| 2017/0155094 A1 | 6/2017 | Joung et al. | |

* cited by examiner

ELECTROLUMINESCENT DEVICE

CROSS-REFERENCE TO RELATED APPLICATIONS

This application claims the benefit under 35 U.S.C. § 119(a) of Korean Patent Application No. 10-2017-0124972, filed on Sep. 27, 2017, in the Korean Intellectual Property Office, which is incorporated herein by reference in its entirety.

BACKGROUND

1. Technical Field

The present disclosure relates to an electroluminescent device, and more particularly, to an electroluminescent device capable of adjusting a color temperature while improving light extraction efficiency.

2. Discussion of the Related Art

An electroluminescent device uses a self-luminous light-emitting diode, thereby having advantages including a high response speed, high luminous efficiency, high brightness, and large viewing angles.

Light emitted from the light-emitting diode of the electroluminescent device passes through various elements of the electroluminescent device and exits the electroluminescent device.

However, since some of light emitted from a light-emitting layer is trapped in the electroluminescent device instead of exiting the electroluminescent device, there is a problem that the light extraction efficiency of the electroluminescent device is lowered.

Also, a concept of so-called "emotional lighting" has been recently introduced. In this way, there has been an increase in demand for selectively using white light sources that emit cool white light having a high color temperature and warm white light having a low color temperature in accordance with a user's preference and a purpose of use.

However, there is a difficulty of having to adjust an intensity of a spectrum for each wavelength range of emitted light in order to realize desired luminescent color. For such a difficulty, a doping technique in which a material is added to a light-emitting layer and a method in which an organic material layer is added to an existing structure has been introduced. However, the doping technique and the layer adding method have problems in that they are accompanied by material development and require that a conventional process be changed.

SUMMARY

Accordingly, embodiments of the present disclosure are directed to an electroluminescent device that substantially obviates one or more of the problems due to limitations and disadvantages of the related art.

An object of the present disclosure is to provide an electroluminescent device which allows a single subpixel to be driven by being divided into a main subpixel and an auxiliary subpixel having different color temperatures, thereby being capable of adjusting a color temperature while improving light extraction efficiency.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, an electroluminescent device comprises a substrate which has a subpixel including a main subpixel and an auxiliary subpixel; a first thin film transistor and a second thin film transistor disposed on the substrate, the first thin film transistor corresponding to the main subpixel and the second thin film transistor corresponding to the auxiliary subpixel; an overcoat layer on the first and second thin film transistors; a first bottom electrode and a second bottom electrode on the overcoat layer, the first bottom electrode corresponding to the main subpixel and the second bottom electrode corresponding to the auxiliary subpixel; a light-emitting layer on the first bottom electrode and the second bottom electrode; and a top electrode on the light-emitting layer, wherein the main subpixel and the auxiliary subpixel have different color temperatures.

It is to be understood that both the foregoing general description and the following detailed description are by example and explanatory and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this application, illustrate embodiments of the disclosure and together with the description serve to explain various principles. In the drawings.

DETAILED DESCRIPTION

Hereinafter, example embodiments of the present disclosure will be described with reference to the accompanying drawings.

First Embodiment

Figure 1:
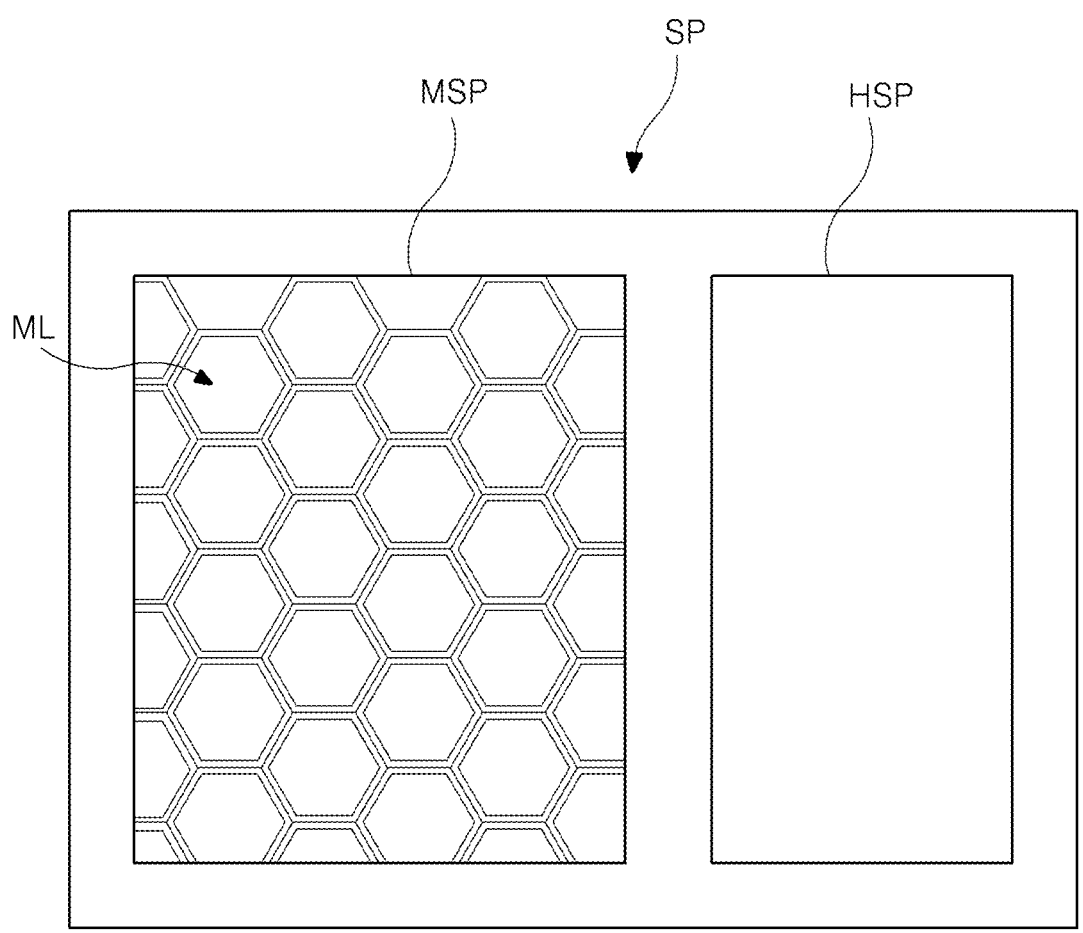
FIG. 1 is a plan view schematically illustrating a subpixel of an electroluminescent device according to a first embodiment of the present disclosure.
Figure 2:
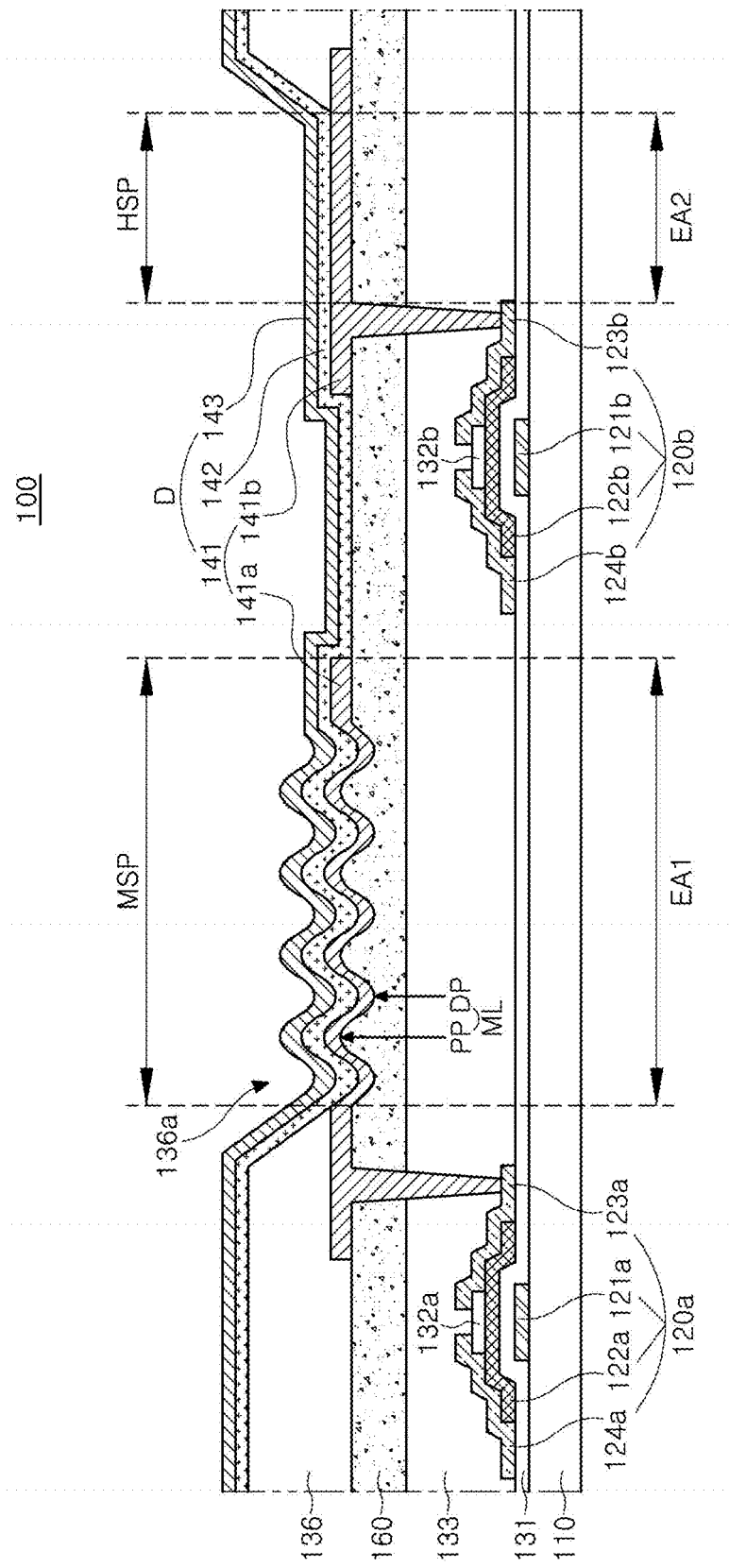
FIG. 2 is a cross-sectional view schematically illustrating the subpixel of the electroluminescent device according to the first embodiment of the present disclosure.

FIG. 1 is a plan view schematically illustrating a subpixel of an electroluminescent device according to a first embodiment of the present disclosure, and FIG. 2 is a cross-sectional view schematically illustrating the subpixel of the electroluminescent device according to the first embodiment of the present disclosure.

The electroluminescent device may be one of an electroluminescent display device displaying an image, a lighting device, and a light source.

For example, when the electroluminescent device is an electroluminescent display device, the electroluminescent device may be at least one of a bottom emission display device, a top emission display device, a dual emission display device, a flexible display device, and a transparent display device, but is not necessarily limited thereto.

When the electroluminescent device is a lighting device, the electroluminescent device may be an indoor/outdoor lighting device, a vehicular lighting device, or the like, or may be combined with other instruments and applied to the above-mentioned lighting devices.

For example, the vehicular lighting device may be at least one of headlights, high beams, taillights, stop lamps, backup lights, brake lights, fog lamps, turn signal lights, and auxiliary lamps, but is not necessarily limited thereto.

When the electroluminescent device is a light source, the electroluminescent device may be effectively applied as, for example, a backlight of a liquid crystal display (LCD) device, various lighting sensors, light sources of a printer, a copy machine, or the like, a light source of a vehicle dashboard, traffic light, an indicating lamp, a light source of a surface emitter, an ornament, or various lights.

Hereinafter although description will be given which assumes that an electroluminescent device is an electroluminescent display device, embodiments are not limited thereto, and the electroluminescent device may also be a lighting device or a light source.

As illustrated in FIG. 1, a single subpixel SP of the electroluminescent device according to the first embodiment of the present disclosure includes a main subpixel MSP and an auxiliary subpixel HSP.

Here, the main subpixel MSP and the auxiliary subpixel HSP may correspond to emissive areas.

An area other than the main subpixel MSP and the auxiliary subpixel HSP may be a non-emissive area.

Here, although the main subpixel MSP and the auxiliary subpixel HSP are each illustrated as having a quadrilateral shape in plan view, embodiments are not limited thereto.

That is, the main subpixel MSP and the auxiliary subpixel HSP may also have a circular shape or a polygonal shape, such as a triangular shape or a pentagonal shape in plan view.

Although a single main subpixel MSP and a single auxiliary subpixel HSP are disposed, this is merely an example. Within a single subpixel, a plurality of auxiliary subpixels HSP may be disposed, or a plurality of main subpixels MSP and a plurality of auxiliary subpixels HSP may be disposed.

Although an area of the main subpixel MSP may be larger than that of the auxiliary subpixel HSP, this is merely an example. Areas of the main subpixel MSP and the auxiliary subpixel HSP may be equal, or an area of the auxiliary subpixel HSP may be larger than that of the main subpixel MSP.

To improve the light extraction efficiency of the electroluminescent device, a micro lens array (MLA) may be attached to an outer side of a substrate of the electroluminescent device or a micro lens is formed in an overcoat layer of the electroluminescent device. Accordingly, a micro lens ML may be formed in the main subpixel MSP.

That is, a micro lens ML which has a hexagonal shape in plan view may be formed in the main subpixel MSP. However, embodiments are not limited thereto, and the micro lens ML may have various other shapes, such as a circular shape and an elliptical shape in plan view.

As illustrated in FIG. 2, an electroluminescent device 100 according to the first embodiment of the present disclosure includes a substrate 110, a first thin film transistor 120a, a second thin film transistor 120b, an overcoat layer 160, and a light-emitting diode D electrically connected to the first thin film transistor 120a and the second thin film transistor 120b.

Although the electroluminescent device 100 according to the first embodiment of the present disclosure is illustrated as a bottom emission type in which light from a light-emitting layer 142 is output to the outside through a bottom electrode 141, embodiments are not limited thereto.

That is, the electroluminescent device 100 according to the first embodiment of the present disclosure may also be a top emission type in which light from the light-emitting layer 142 is output to the outside through a top electrode 143.

When the electroluminescent device 100 is the top emission type, a reflective electrode or reflective layer may be further formed below the bottom electrode 141. For example, the reflective electrode or reflective layer may be formed of an aluminum-palladium-copper (APC) alloy. In this case, the top electrode 143 may have a relatively thin thickness to allow light to transmit therethrough.

In the electroluminescent device 100 according to the first embodiment of the present disclosure, the first thin film transistor 120a which includes a first gate electrode 121a, a first active layer 122a, a first source electrode 123a, and a first drain electrode 124a, and the second thin film transistor 120b which includes a second gate electrode 121b, a second active layer 122b, a second source electrode 123b, and a second drain electrode 124b may be disposed in the single subpixel SP on the substrate 110.

Specifically, the first gate electrode 121a and the second gate electrode 121b may be disposed on the substrate 110, and a gate insulation layer 131 may be disposed on each of the first gate electrode 121a and the second gate electrode 121b. The gate insulation layer 131 may be disposed on a substantially entire surface of the substrate 110.

The first active layer 122a and the second active layer 122b which respectively overlap the first gate electrode 121a and the second gate electrode 121b may be disposed on the gate insulation layer 131.

A first etch stopper 132a and a second etch stopper 132b configured to protect channel areas of the first active layer 122a and the second active layer 122b may be respectively disposed on the first active layer 122a and the second active layer 122b.

The first source electrode 123a and the first drain electrode 124a contacting the first active layer 122a may be disposed on the first active layer 122a, and the second source electrode 123b and the second drain electrode 124b contacting the second active layer 122b may be disposed on the second active layer 122b.

The electroluminescent device to which embodiments of the present disclosure are applicable is not limited to that shown in FIG. 2. The electroluminescent device may further include a buffer layer disposed between the substrate 110 and the first and second active layers 122a and 122b and may not include the first and second etch stoppers 132a and 132b.

For convenience of description, only driving thin film transistors have been illustrated from among various thin film transistors that may be included in the electroluminescent device 100. Although the first and second thin film transistors 120a and 120b will be described as having an inverted staggered structure or bottom gate structure in which, with respect to the first and second active layer 122a and 122b, the first and second gate electrodes 121a and 121b are disposed opposite the first and second source electrodes 123a and 123b and the first and second drain electrodes 124a and 124b, this is merely an example, and thin film transistors which have a coplanar structure or top gate structure in which, with respect to the first and second active layers 122a and 122b, the first and second gate electrodes 121a and 121b are disposed at the same side as the first and second source electrodes 123a and 123b and the first and second drain electrodes 124a and 124b may also be used.

A passivation layer 133 may be disposed on the first and second drain electrodes 124a and 124b and the first and second source electrodes 123a and 123b of the first and second thin film transistors 120a and 120b.

In this case, although the passivation layer 133 is illustrated as flattening upper portions of the first and second thin film transistors 120a and 120b, the passivation layer 133 may also be disposed along the shapes of surfaces of configurations located below the passivation layer 133 instead of flattening the upper portions of the first and second thin film transistors 120a and 120b.

In this case, the overcoat layer 160 may be disposed on the passivation layer 133.

The passivation layer 133 may be omitted. That is, the overcoat layer 160 may also be directly disposed on the first and second thin film transistors 120a and 120b.

The present disclosure may include one or more subpixels. Also, two to four subpixels SP may form a pixel.

In this case, the subpixel SP refers to a unit in which the light-emitting diode D is capable of emitting a particular color.

Particularly, the subpixel SP of the electroluminescent device 100 according to the first embodiment of the present disclosure may include the main subpixel MSP and the auxiliary subpixel HSP.

The main subpixel MSP may correspond to a first emissive area EA1, and the auxiliary subpixel HSP may correspond to a second emissive area EA2.

In this case, the first and second emissive areas EA1 and EA2 refer to areas in which the light-emitting layer 142 emits light due to the bottom electrode 141 and the top electrode 143.

That is, an area in which the light-emitting layer 142 emits light due to a first bottom electrode 141a and the top electrode 143 may be defined as the first emissive area EA1, and an area in which the light-emitting layer 142 emits light due to a second bottom electrode 141b and the top electrode 143 may be defined as the second emissive area EA2.

Therefore, two emissive areas EA1 and EA2 may be disposed in the single subpixel SP in the electroluminescent device 100 according to the first embodiment of the present disclosure. However, embodiments are not limited thereto, and three or more emissive areas may also be disposed in the single subpixel SP in the electroluminescent device 100 in accordance with the number of main subpixels MSP and auxiliary subpixels HSP constituting the subpixel SP.

To improve the light extraction efficiency, the electroluminescent device 100 according to the first embodiment of the present disclosure may include the micro lens ML disposed in the overcoat layer 160 corresponding to the main subpixel MSP.

Here, the micro lens ML may include a plurality of depressed portions DP and a plurality of protruding portions PP, but embodiments are not limited thereto, and the micro lens ML may have various other forms.

For example, a micro lens ML which includes protruding portions PP and connecting portions connecting adjacent protruding portions PP may be formed in the overcoat layer 160.

In an area in which the plurality of depressed portions DP and the plurality of protruding portions PP are not disposed, the overcoat layer 160 serves as a planarization layer. That is, in an area other than the main subpixel MSP, the overcoat layer 160 may have a flat top surface.

Here, each of the plurality of depressed portions DP may have various shapes, such as a hexagonal shape, a semicircular shape, a semi-elliptical shape, and a quadrilateral shape in plan view.

The light-emitting diode D which includes the bottom electrode 141, the light-emitting layer 142, and the top electrode 143 may be disposed on the overcoat layer 160.

To block the spread of outgassing from the overcoat layer 160 to the light-emitting diode D, a second passivation layer (not shown) having an insulating property may be disposed between the overcoat layer 160 and the bottom electrode 141.

That is, the second passivation layer, which follows the morphology of the plurality of depressed portions DP and the plurality of protruding portions PP of the overcoat layer 160 exactly, may be disposed between the overcoat layer 160 and the bottom electrode 141.

The bottom electrode 141 may be disposed on the overcoat layer 160.

Here, the bottom electrode 141 may be an anode or cathode for supplying electrons or holes to the light-emitting layer 142.

A case in which the bottom electrode 141 of the electroluminescent device 100 according to the first embodiment of the present disclosure is an anode will be described as an example.

The bottom electrode 141 may be formed of a conductive material having relatively high work function. For example, the bottom electrode 141 may be formed of a transparent conductive material such as indium-tin-oxide (ITO) and indium-zinc-oxide (IZO).

Particularly, the bottom electrode 141 of the electroluminescent device 100 according to the first embodiment of the present disclosure may include the first bottom electrode 141a and the second bottom electrode 141b.

The first and second bottom electrodes 141a and 141b may be separately formed for the main subpixel MSP and the auxiliary subpixel HSP, respectively.

That is, the first bottom electrode 141a and the second bottom electrode 141b may be disposed in the main subpixel MSP and the auxiliary subpixel HSP, respectively.

For example, the first bottom electrode 141a may be disposed in the main subpixel MSP, and the second bottom electrode 141b may be separately disposed in the auxiliary subpixel HSP.

That is, when a plurality of main subpixels MSP and auxiliary subpixels HSP constitute a single subpixel SP, the bottom electrode 141 may be disposed to correspond to each of the main subpixels MSP and the auxiliary subpixels HSP.

The first bottom electrode 141a and the second bottom electrode 141b may be connected to the first thin film transistor 120a and the second thin film transistor 120b, respectively.

For example, the first bottom electrode 141a may be connected to the first source electrode 123a of the first thin film transistor 120a through a first contact hole formed in the overcoat layer 160, and the second bottom electrode 141b may be connected to the second source electrode 123b of the second thin film transistor 120b through a second contact hole formed in the overcoat layer 160. The first and second contact holes may also be formed in the passivation layer 133.

Although the electroluminescent device 100 according to the first embodiment of the present disclosure has been described using an example which assumes that the thin film transistors are N-type thin film transistors in which the bottom electrode 141 is connected to the first and second source electrodes 123a and 123b, embodiments are not limited thereto. When the thin film transistors are P-type thin film transistors, the bottom electrode 141 may also be connected to the first and second drain electrodes 124a and 124b.

The bottom electrode 141 may also be electrically connected to the light-emitting layer 142 by being in contact with the light-emitting layer 142 with a conductive material therebetween.

Here, the first bottom electrode 141a and the second bottom electrode 141b may be disposed in a shape that follows the morphology of the surface of the overcoat layer 160.

That is, the first bottom electrode 141a may be disposed in a form which follows the morphology of the plurality of depressed portions DP and the plurality of protruding portions PP of the overcoat layer 160 exactly, and the second bottom electrode 141b may be disposed in a form which has a flat top surface.

A bank layer 136 may be disposed on the overcoat layer 160 and the bottom electrode 141.

The bank layer 136 may include an opening 136a which exposes the bottom electrode 141.

Here, the bank layer 136 may be disposed between adjacent pixel (or subpixel) areas and serve to differentiate the adjacent pixel (or subpixel) areas.

In this case, the main subpixel MSP and the auxiliary subpixel HSP may be disposed in the opening 136a of the bank layer 136.

Also, the light-emitting layer 142 may be disposed on the exposed first bottom electrode 141a and second bottom electrode 141b.

Here, the light-emitting layer 142 may emit white light.

For example, the light-emitting layer 142 may have a tandem white structure in which a plurality of light-emitting layers are stacked, but embodiments are not limited thereto.

When the light-emitting layer 142 has the tandem white structure in which a plurality of light-emitting layers are stacked, the light-emitting layer 142 may include a first light-emitting layer configured to emit blue light and a second light-emitting layer disposed on the first light-emitting layer and configured to emit light having a color which turns white when mixed with blue. The second light-emitting layer may be a light-emitting layer configured to emit yellow-green light.

The light-emitting layer 142 may include only light-emitting layers that emit one of blue light, red light, and green light.

Here, a luminescent material of the light-emitting layer 142 may be an organic luminescent material or an inorganic luminescent material such as a quantum dot.

Also, the light-emitting layer 142 may have a shape which follows the morphology of the overcoat layer 160.

That is, the light-emitting layer 142 may be disposed in a form which follows the morphology of the plurality of depressed portions DP and the plurality of protruding portions PP of the overcoat layer 160 in the main subpixel MSP exactly and disposed in a form which has a flat top surface in the auxiliary subpixel HSP.

The top electrode 143 for supplying one of electrons or holes to the light-emitting layer 142 may be disposed on the light-emitting layer 142.

Here, the top electrode 143 may be an anode or a cathode.

A case in which the top electrode 143 of the electroluminescent device 100 according to the first embodiment of the present disclosure is a cathode will be described as an example.

The top electrode 143 may be formed of a conductive material having relatively low work function and may be located on a substantially entire surface of a display area.

For example, the top electrode 143 may be formed of aluminum (Al), magnesium (Mg), silver (Ag), or an alloy thereof, but embodiments are not limited thereto.

Here, the top electrode 143 may have a shape which follows the morphology of the overcoat layer 160.

That is, the top electrode 143 may be disposed in a form which follows the morphology of the plurality of depressed portions DP and the plurality of protruding portions PP of the overcoat layer 160 in the main subpixel MSP exactly and disposed in a form which has a flat top surface in the auxiliary subpixel HSP.

The above-described first bottom electrode 141a, second bottom electrode 141b, light-emitting layer 142, and top electrode 143 constitute the light-emitting diode D.

Particularly, the light-emitting diode D of the electroluminescent device 100 according to the first embodiment of the present disclosure may be disposed in the form which follows the morphology of the plurality of depressed portions DP and the plurality of protruding portions PP of the overcoat layer 160 in the main subpixel MSP exactly and disposed in a form which has a flat top surface in the auxiliary subpixel HSP.

Accordingly, the main subpixel MSP and the auxiliary subpixel HSP whose color temperatures differ may be realized in the single subpixel SP.

Also, the light-emitting diode D may be driven independently in the main subpixel MSP and the auxiliary subpixel HSP.

Here, generally, a chromaticity of a light source or reference white may be expressed with, instead of coordinates on the two-dimensional chromaticity diagram, a temperature of an area closest to a color temperature curve of a black-body radiator. This temperature is referred to as correlated color temperature (CCT) or color temperature.

Color temperature is used as a numerical value which indicates an extent to which white is close to a certain color. While a display device expresses a color, the color temperature is high when the color is close to blue, and the color temperature is low when the color is close to yellow.

Figure 3A:
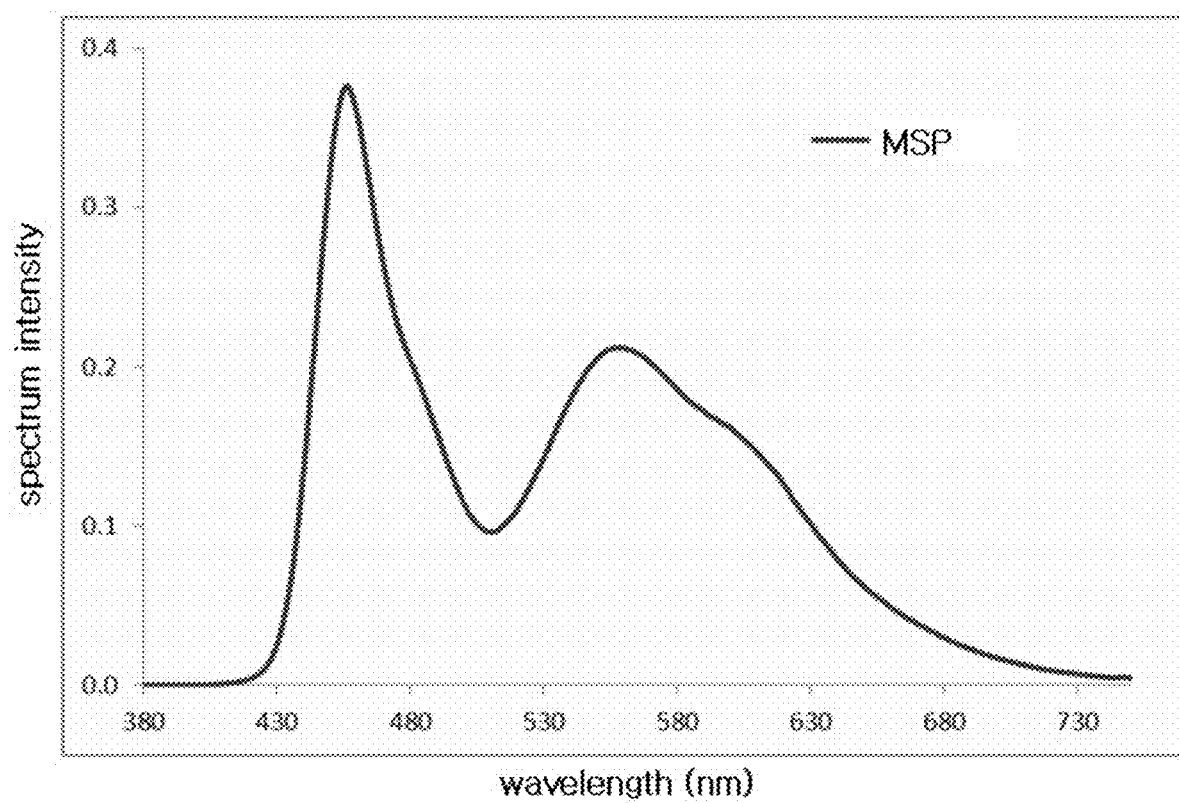
FIG. 3A is a graph illustrating an optical spectrum of a main subpixel of the electroluminescent device according to the first embodiment of the present disclosure.
Figure 3B:
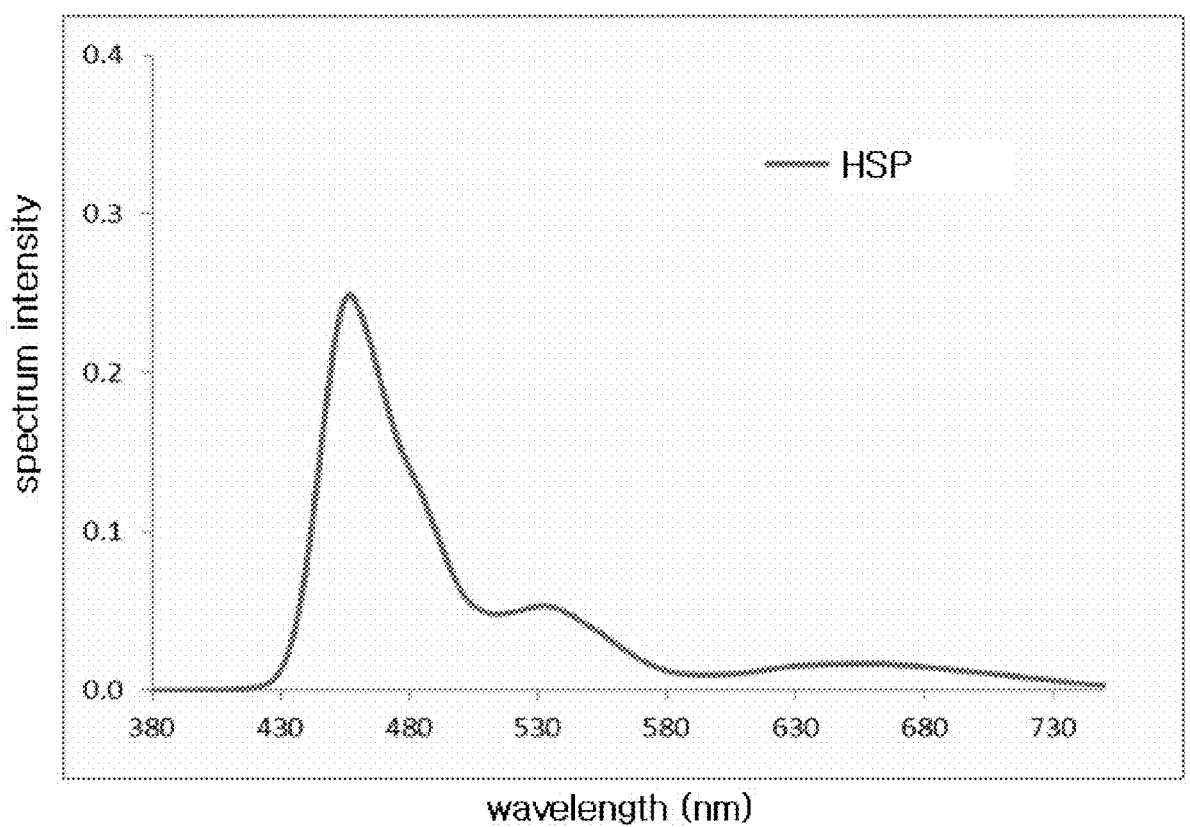
FIG. 3B is a graph illustrating an optical spectrum of an auxiliary subpixel of the electroluminescent device according to the first embodiment of the present disclosure.

FIG. 3A is a graph illustrating an optical spectrum of a main subpixel of the electroluminescent device according to the first embodiment of the present disclosure, and FIG. 3B is a graph illustrating an optical spectrum of an auxiliary subpixel of the electroluminescent device according to the first embodiment of the present disclosure.

As illustrated in FIGS. 3A and 3B, the main subpixel MSP and the auxiliary subpixel HSP of the electroluminescent device 100 according to the first embodiment of the present disclosure have different optical spectra.

For example, a spectrum intensity of the main subpixel MSP is exhibited to be higher than that of the auxiliary subpixel HSP at 560 nm, which is in the green wavelength range, and at 650 nm, which is in the red wavelength range.

Accordingly, when the auxiliary subpixel HSP whose spectrum intensity is relatively high at 460 nm, which is in the blue wavelength range, is driven, a spectrum intensity of light output from the subpixel SP may be increased at 460 nm, which is in the blue wavelength range, due to mixed light of the main subpixel MSP and the auxiliary subpixel HSP.

Also, since the auxiliary subpixel HSP may be driven independently, the color temperature of the electroluminescent device 100 may be adjusted to various values by controlling a voltage applied to the auxiliary subpixel HSP so as to vary a spectrum of the mixed light of the main subpixel MSP and the auxiliary subpixel HSP.

As described above, the overcoat layer 160 including the micro lens ML, which comprises the plurality of depressed portions DP and the plurality of protruding portions PP, is disposed in the main subpixel MSP in the electroluminescent device 100 according to the first embodiment of the present disclosure. Accordingly, light, which has not been extracted to the outside due to total reflection of the light emitted from the light-emitting layer 142 inside the first bottom electrode 141a and the light-emitting layer 142, may be made to travel at an angle which is smaller than a total reflection critical angle. Therefore, external luminous efficiency may be improved through multiple reflections.

Further, by arranging the auxiliary subpixel HSP having a different color temperature from that of the main subpixel MSP, the color temperature of the electroluminescent device may be varied through the mixed light of the main subpixel MSP and the auxiliary subpixel HSP.

Second Embodiment

Hereinafter, detailed description of configurations identical or similar to those of the first embodiment may be omitted.

Figure 4:
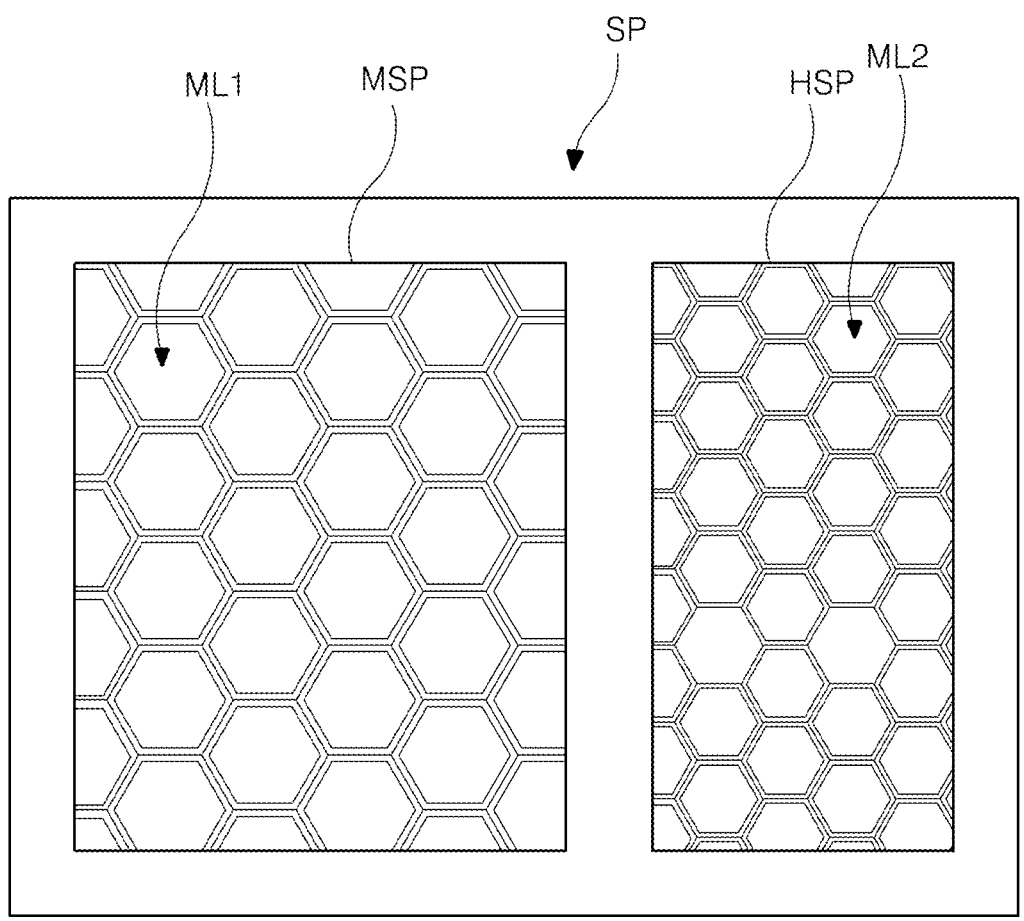
FIG. 4 is a plan view schematically illustrating a subpixel of an electroluminescent device according to a second embodiment of the present disclosure.
Figure 5:
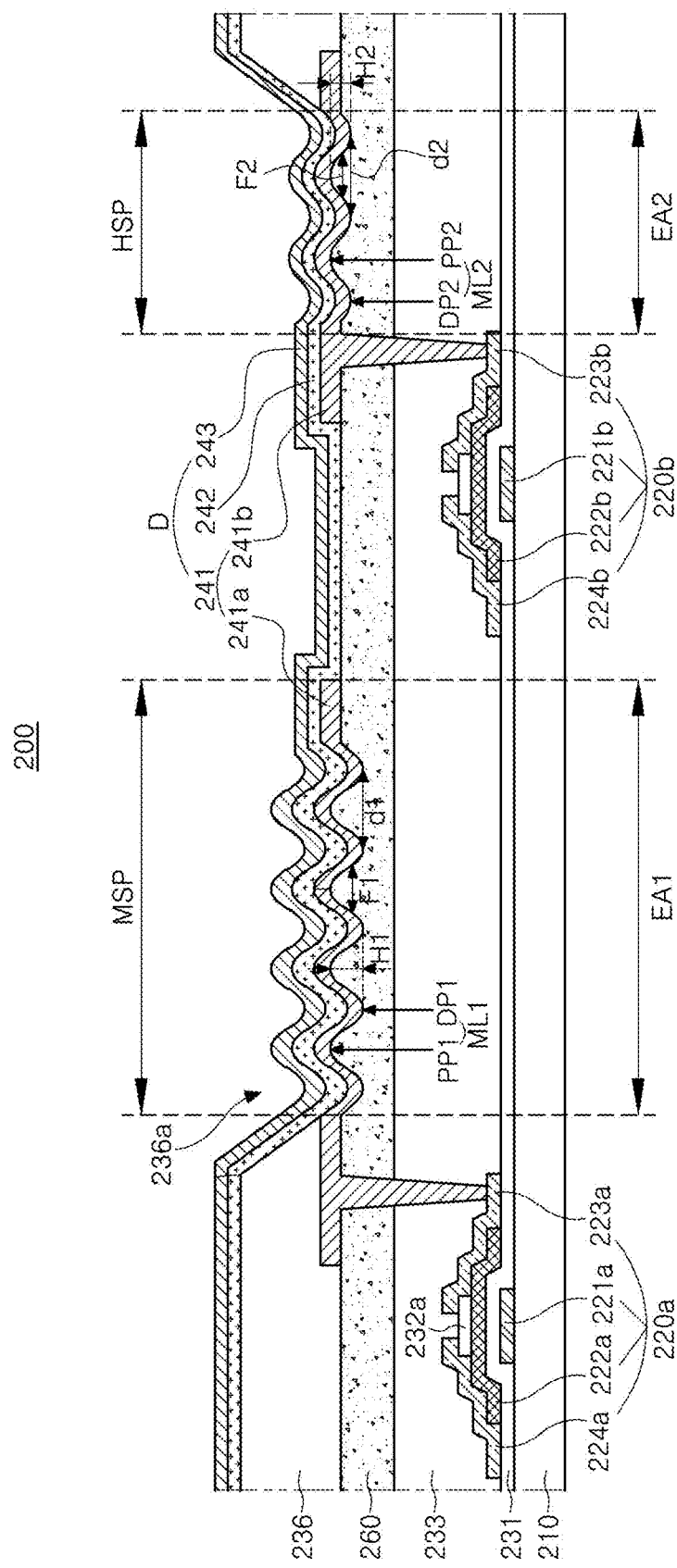
FIG. 5 is a cross-sectional view schematically illustrating the subpixel of the electroluminescent device according to the second embodiment of the present disclosure.

FIG. 4 is a plan view schematically illustrating a subpixel of an electroluminescent device according to a second embodiment of the present disclosure, and FIG. 5 is a cross-sectional view schematically illustrating the subpixel of the electroluminescent device according to the second embodiment of the present disclosure.

As illustrated in FIG. 4, a single subpixel SP of the electroluminescent device according to the second embodiment of the present disclosure includes a main subpixel MSP and an auxiliary subpixel HSP.

Here, the main subpixel MSP and the auxiliary subpixel HSP may correspond to emissive areas.

An area other than the main subpixel MSP and the auxiliary subpixel HSP may be a non-emissive area.

Here, although the main subpixel MSP and the auxiliary subpixel HSP are each illustrated as having a quadrilateral shape in plan view, embodiments are not limited thereto.

That is, the main subpixel MSP and the auxiliary subpixel HSP may also have a circular shape or a polygonal shape, such as a triangular shape or a pentagonal shape in plan view.

Although a single main subpixel MSP and a single auxiliary subpixel HSP are disposed, this is merely an example. A plurality of auxiliary subpixels HSP may be disposed, or a plurality of main subpixels MSP and a plurality of auxiliary subpixels HSP may be disposed.

Although an area of the main subpixel MSP may be larger than that of the auxiliary subpixel HSP, this is merely an example. Areas of the main subpixel MSP and the auxiliary subpixel HSP may be equal, or an area of the auxiliary subpixel HSP may be larger than that of the main subpixel MSP.

Particularly, micro lenses ML1 and ML2 may be formed in the main subpixel MSP and the auxiliary subpixel HSP, respectively.

That is, a first micro lens ML1 may be disposed in the main subpixel MSP, and a second micro lens ML2, which differs from the first micro lens ML1, may be disposed in the auxiliary subpixel HSP.

Here, although the first and second micro lenses ML1 and ML2 are illustrated as having a hexagonal shape in plan view, embodiments are not limited thereto, and the first and second micro lenses ML1 and ML2 may have various other shapes such as a circular shape and an elliptical shape in plan view.

As illustrated in FIG. 5, an electroluminescent device 200 according to the second embodiment of the present disclosure includes a substrate 210, a first thin film transistor 220a, a second thin film transistor 220b, an overcoat layer 260, and a light-emitting diode D electrically connected to the first thin film transistor 220a and the second thin film transistor 220b.

Here, the first thin film transistor 220a which includes a first gate electrode 221a, a first active layer 222a, a first source electrode 223a, and a first drain electrode 224a, and the second thin film transistor 220b which includes a second gate electrode 221b, a second active layer 222b, a second source electrode 223b, and a second drain electrode 224b may be disposed in the subpixel SP on the substrate 210.

A passivation layer 233 may be disposed on the first and second drain electrodes 224a and 224b and the first and second source electrodes 223a and 223b of the first and second thin film transistors 220a and 220b.

The overcoat layer 260 may be disposed on the passivation layer 233.

The passivation layer 233 may be omitted. That is, the overcoat layer 260 may also be disposed on the first and second thin film transistors 220a and 220b.

Particularly, the subpixel SP of the electroluminescent device 200 according to the second embodiment of the present disclosure may include the main subpixel MSP and the auxiliary subpixel HSP.

The main subpixel MSP may correspond to a first emissive area EA1, and the auxiliary subpixel HSP may correspond to a second emissive area EA2.

Here, the first and second emissive areas EA1 and EA2 refer to areas in which light-emitting layer 242 emits light due to a bottom electrode 241 and a top electrode 243.

That is, an area in which the light-emitting layer 242 emits light due to a first bottom electrode 241a and the top electrode 243 may be defined as the first emissive area EA1, and an area in which the light-emitting layer 242 emits light due to a second bottom electrode 241b and the top electrode 243 may be defined as the second emissive area EA2.

Therefore, two emissive areas EA1 and EA2 may be disposed in the single subpixel SP in the electroluminescent device 200 according to the second embodiment of the present disclosure. However, embodiments are not limited thereto, and three or more emissive areas may also be disposed in the electroluminescent device 200 in accordance with the number of main subpixels MSP and auxiliary subpixels HSP constituting the subpixel SP.

Particularly, to improve the light extraction efficiency and adjust a color temperature, the electroluminescent device 200 according to the second embodiment of the present disclosure may include the first micro lens ML1 and the second micro lens ML2 disposed to correspond to the main subpixel MSP and the auxiliary subpixel HSP, respectively.

That is, the first micro lens ML1 may be formed in the overcoat layer 260 which corresponds to the main subpixel MSP, and the second micro lens ML2, which differs from the first micro lens ML1, may be formed in the overcoat layer 260 which corresponds to the auxiliary subpixel HSP.

Here, the first micro lens ML1 may include a plurality of first depressed portions DP1 and a plurality of first protruding portions PP1, and the second micro lens ML2 may include a plurality of second depressed portions DP2 and a plurality of second protruding portions PP2. However, embodiments are not limited thereto, and the first and second micro lenses ML1 and ML2 may have various other forms.

In an area in which the plurality of first and second depressed portions DP1, DP2 and the plurality of first and second protruding portions PP1 and PP2 are not disposed, the overcoat layer 260 serves as a planarization layer. That is, in an area other than the main subpixel MSP and the auxiliary subpixel HSP, the overcoat layer 260 may have a flat top surface.

Here, each of the plurality of first and second depressed portions DP1 and DP2 may have a hexagonal shape in plan view. However, embodiments are not limited thereto, and the plurality of first and second depressed portions DP1 and DP2 may have various shapes, such as a semicircular shape, a semi-elliptical shape, or a quadrilateral shape, in plan view.

Particularly, the first micro lens ML1 and the second micro lens ML2 disposed in the subpixel SP of the electroluminescent device 200 according to the second embodiment of the present disclosure may differ from each other.

That is, at least one of a width d1, a height H1, a half-width F1, an aspect ration A/R of the first protruding portions PP1 or the first depressed portions DP1 of the first micro lens ML1, or a distance from the first protruding portions PP1 or the first depressed portions DP1 to the bottom may be different from the corresponding one of a width d2, a height H2, a half-width F2, an aspect ratio A/R of the second protruding portions PP2 or the second depressed portions DP2 of the second micro lens ML2, or a distance from the second protruding portions PP2 or the second depressed portions DP2 to the bottom.

Here, the width d1 of the first protruding portions PP1 refers to a length between centers of two adjacent first depressed portions DP1, and the height H1 refers to a length from the bottom of the first depressed portion DP1 to the peak of the first protruding portion PP1 in a vertical direction. Similarly, the width d2 of the second protruding portions PP2 refers to a length between centers of two adjacent second depressed portions DP2, and the height H2 refers to a length from the bottom of the second depressed portion DP2 to the peak of the second protruding portion PP2 in the vertical direction.

The half-width F1 refers to a length between two adjacent first depressed portions DP1 at half the height H1, and the aspect ratio A/R of the first protruding portions PP1 refers to a value obtained by dividing the height H1 by a radius of the first protruding portion PP1. Similarly, the half-width F2 refers to a length between two adjacent second depressed portions DP2 at half the height H2, and the aspect ratio A/R of the second protruding portions PP2 refers to a value obtained by dividing the height H2 by a radius of the second protruding portion PP2.

The heights H1 and H2 of the respective first and second protruding portions PP1 and PP2 of the first micro lens ML1 and the second micro lens ML2 may be in a range of 0.5 μm to 3 μm, and the widths d1 and d2 of the respective first and second protruding portions PP1 and PP2 of the first micro lens ML1 and the second micro lens ML2 may be in a range of 1 μm to 10 μm.

That is, the first micro lens M11 and the second micro lens ML2 may have different shapes within the height range of 0.5 μm to 3 μm and the width range of 1 μm to 10 μm.

For example, the height H1 of the first protruding portions PP1 may be in the range of 0.9 μm to 1 μm, the width d1 of the first protruding portions PP1 may be in the range of 4.4 μm to 4.6 μm, the height H2 of the second protruding portions PP2 may be in the range of 0.6 μm to 0.85 μm, and the width d2 of the second protruding portions PP2 may be in the range of 4.1 μm to 4.3 μm, but embodiments are not limited thereto.

Also, the half-width F1 of the first protruding portions PP1 may be in the range of 1.5 μm to 1.65 μm, and the half-width F2 of the second protruding portions PP2 may be in the range of 1.7 μm to 1.8 μm, but embodiments are not limited thereto.

In addition, the aspect ratio A/R of the first protruding portions PP1 may be in the range of 0.4 to 0.5, and the aspect ratio A/R of the second protruding portions PP2 may be in the range of 0.25 to 0.35, but embodiments are not limited thereto.

That is, since the first micro lens ML1 and the second micro lens ML2 differ from each other, the electroluminescent device 200 may have various forms in which color temperatures of the main subpixel MSP and the auxiliary subpixel HSP are realized to be different from each other.

The light-emitting diode D which includes the bottom electrode 241, the light-emitting layer 242, and the top electrode 243 may be disposed on the overcoat layer 260.

To block the spread of outgassing from the overcoat layer 260 to the light-emitting diode D, a second passivation layer (not shown) having an insulating property may be disposed between the overcoat layer 260 and the bottom electrode 241.

That is, the second passivation layer, which follows the morphology of the first micro lens ML1 and the second micro lens ML2 of the overcoat layer 260 exactly, may be disposed between the overcoat layer 260 and the bottom electrode 241.

The bottom electrode 241 may be disposed on the overcoat layer 260.

Here, the bottom electrode 241 may be an anode or cathode for supplying electrons or holes to the light-emitting layer 242.

A case in which the bottom electrode 241 of the electroluminescent device 200 according to the second embodiment of the present disclosure is an anode will be described as an example.

The bottom electrode 241 may be formed of a conductive material having relatively high work function. For example, the bottom electrode 241 may be formed of a transparent conductive material such as ITO and IZO.

Particularly, the bottom electrode 241 of the electroluminescent device 200 according to the second embodiment of the present disclosure may include the first bottom electrode 241a and the second bottom electrode 241b.

The first and second bottom electrodes 241a and 241b may be separately formed for the main subpixel MSP and the auxiliary subpixel HSP, respectively.

That is, the first bottom electrode 241a and the second bottom electrode 241b may be disposed in the main subpixel MSP and the auxiliary subpixel HSP, respectively.

For example, the first bottom electrode 241a may be disposed in the main subpixel MSP, and the second bottom electrode 241b may be separately disposed in the auxiliary subpixel HSP.

That is, when a plurality of main subpixels MSP and auxiliary subpixels HSP constitute a single subpixel SP, the bottom electrode 241 may be disposed to correspond to each of the main subpixels MSP and the auxiliary subpixels HSP.

The first bottom electrode 241a and the second bottom electrode 241b may be connected to the first thin film transistor 220a and the second thin film transistor 220b, respectively.

For example, the first bottom electrode 241a may be connected to the first source electrode 223a of the first thin film transistor 220a through a first contact hole formed in the overcoat layer 260, and the second bottom electrode 241b may be connected to the second source electrode 223b of the second thin film transistor 220b through a second contact hole formed in the overcoat layer 260. The first and second contact holes may also be formed in the passivation layer 233.

Here, the first bottom electrode 241a and the second bottom electrode 241b may be disposed in a shape which follows the morphology of the overcoat layer 260.

That is, the first bottom electrode 241a may be disposed in a form which follows the morphology of the plurality of first depressed portions DP1 and the plurality of first protruding portions PP1 of the overcoat layer 260 exactly, and the second bottom electrode 241b may be disposed in a form which follows the morphology of the plurality of second depressed portions DP2 and the plurality of second protruding portions PP2 of the overcoat layer 260 exactly.

A bank layer 236 may be disposed on the overcoat layer 260 and the bottom electrode 241.

The bank layer 236 may include an opening 236a which exposes the bottom electrode 241.

Here, the bank layer 236 may be disposed between adjacent pixel (or subpixel) areas and serve to differentiate the adjacent pixel (or subpixel) areas.

In this case, the main subpixel MSP and the auxiliary subpixel HSP may be disposed in the opening 236a of the bank layer 236.

Also, the light-emitting layer 242 may be disposed on the exposed first bottom electrode 241a and second bottom electrode 241b.

Here, the light-emitting layer 242 may emit white light.

For example, the light-emitting layer 242 may have a tandem white structure in which a plurality of light-emitting layers are stacked, but embodiments are not limited thereto.

When the light-emitting layer 242 has the tandem white structure in which a plurality of light-emitting layers are stacked, the light-emitting layer 242 may include a first light-emitting layer configured to emit blue light and a second light-emitting layer disposed on the first light-emitting layer and configured to emit light having color which turns white when mixed with blue. The second light-emitting layer may be a light-emitting layer configured to emit yellow-green light.

Meanwhile, the light-emitting layer 242 may include only light-emitting layers that emit one of blue light, red light, and green light.

Here, a luminescent material of the light-emitting layer 242 may be an organic luminescent material or an inorganic luminescent material such as a quantum dot.

Also, the light-emitting layer 242 may have a shape which follows the morphology of the overcoat layer 260.

That is, the light-emitting layer 242 may be disposed in a form which follows the morphology of the first micro lens ML1 in the main subpixel MSP exactly and disposed in a form which follows the morphology of the second micro lens ML2 in the auxiliary subpixel HSP exactly.

The top electrode 243 for supplying one of electrons or holes to the light-emitting layer 242 may be disposed on the light-emitting layer 242.

Here, the top electrode 243 may be an anode or a cathode.

A case in which the top electrode 243 of the electroluminescent device 200 according to the second embodiment of the present disclosure is a cathode will be described as an example.

The top electrode 243 may be formed of a conductive material having relatively low work function and may be located on a substantially entire surface of a display area.

For example, the top electrode 243 may be formed of Al, Mg, Ag, or an alloy thereof, but embodiments are not limited thereto.

Here, the top electrode 243 may have a shape which follows the morphology of the overcoat layer 260.

That is, the top electrode 243 may be disposed in the form which follows the morphology of the first micro lens ML1 in the main subpixel MSP exactly and disposed in the form which follows the morphology of the second micro lens ML2 in the auxiliary subpixel HSP exactly.

The above-described first bottom electrode 241a, second bottom electrode 241b, light-emitting layer 242, and top electrode 243 constitute the light-emitting diode D.

Particularly, the light-emitting diode D of the electroluminescent device 200 according to the second embodiment of the present disclosure may be disposed in the form which follows the morphology of the first micro lens ML1 in the main subpixel MSP exactly and disposed in the form which follows the morphology of the second micro lens ML2 in the auxiliary subpixel HSP exactly.

Accordingly, the main subpixel MSP and the auxiliary subpixel HSP whose color temperatures differ may be realized in the single subpixel SP.

Figure 6:
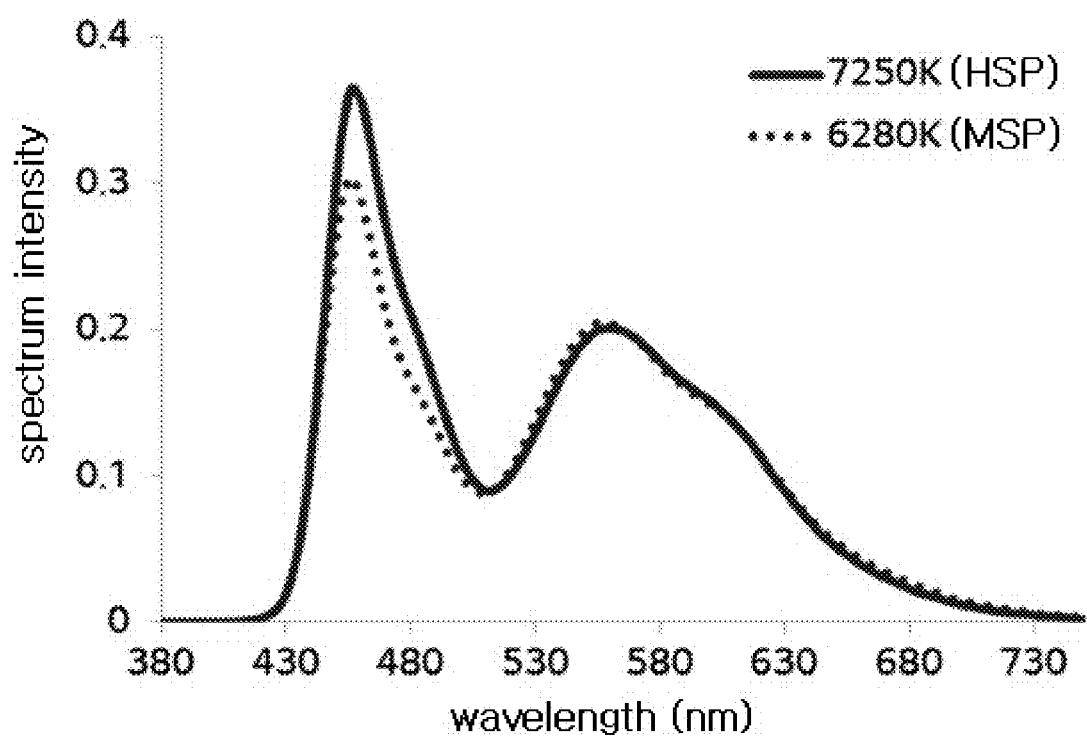
FIG. 6 is a graph illustrating optical spectra of a main subpixel and an auxiliary subpixel of the electroluminescent device according to the second embodiment of the present disclosure.

FIG. 6 is a graph illustrating optical spectra of a main subpixel and an auxiliary subpixel of the electroluminescent device according to the second embodiment of the present disclosure.

As illustrated in FIG. 6, the main subpixel MSP and the auxiliary subpixel HSP of the electroluminescent device 200 according to the second embodiment of the present disclosure have different optical spectra.

For example, a spectrum intensity of the auxiliary subpixel HSP is exhibited to be higher than that of the main subpixel MSP at 460 nm, which is in the blue wavelength range.

Accordingly, when the auxiliary subpixel HSP whose spectrum intensity is relatively high at 460 nm, which is in the blue wavelength range, is driven, a spectrum intensity of light output from the subpixel SP may be increased at 460 nm, which is in the blue wavelength range, due to mixed light of the main subpixel MSP and the auxiliary subpixel HSP.

Also, since the auxiliary subpixel HSP may be driven independently, a spectrum of the mixed light of the main subpixel MSP and the auxiliary subpixel HSP may be varied by adjusting a voltage applied to the auxiliary subpixel HSP.

As described above, the overcoat layer 260 including the first and second micro lens ML1 and ML2 is disposed in the main subpixel MSP and the auxiliary subpixel HSP in the electroluminescent device 200 according to the second embodiment of the present disclosure. Accordingly, light, which has not been extracted to the outside due to total reflection of the light emitted from the light-emitting layer 242 inside the first bottom electrode 241a, the second bottom electrode 241b, and the light-emitting layer 242, may be made to travel at an angle which is smaller than a total reflection critical angle. Therefore, external luminous efficiency may be improved through multiple reflections.

Further, by arranging the micro lens ML1 and ML2, which differ from each other, in the main subpixel MSP and the auxiliary subpixel HSP, the color temperature of the single subpixel SP may be adjusted through the mixed light of the main subpixel MSP and the auxiliary subpixel HSP.

Figure 7A:
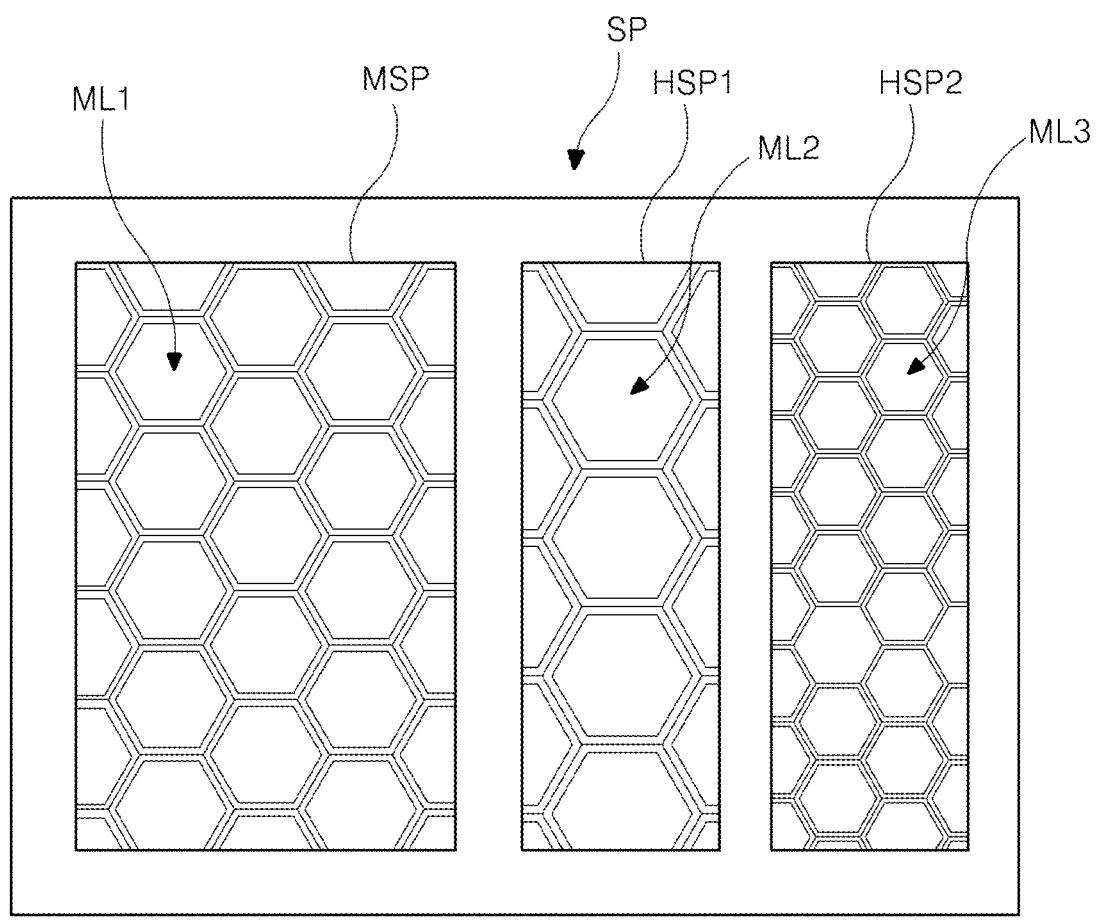
FIG. 7A is a plan view schematically illustrating a modified example of the subpixel of the electroluminescent device according to the second embodiment of the present disclosure.
Figure 7B:
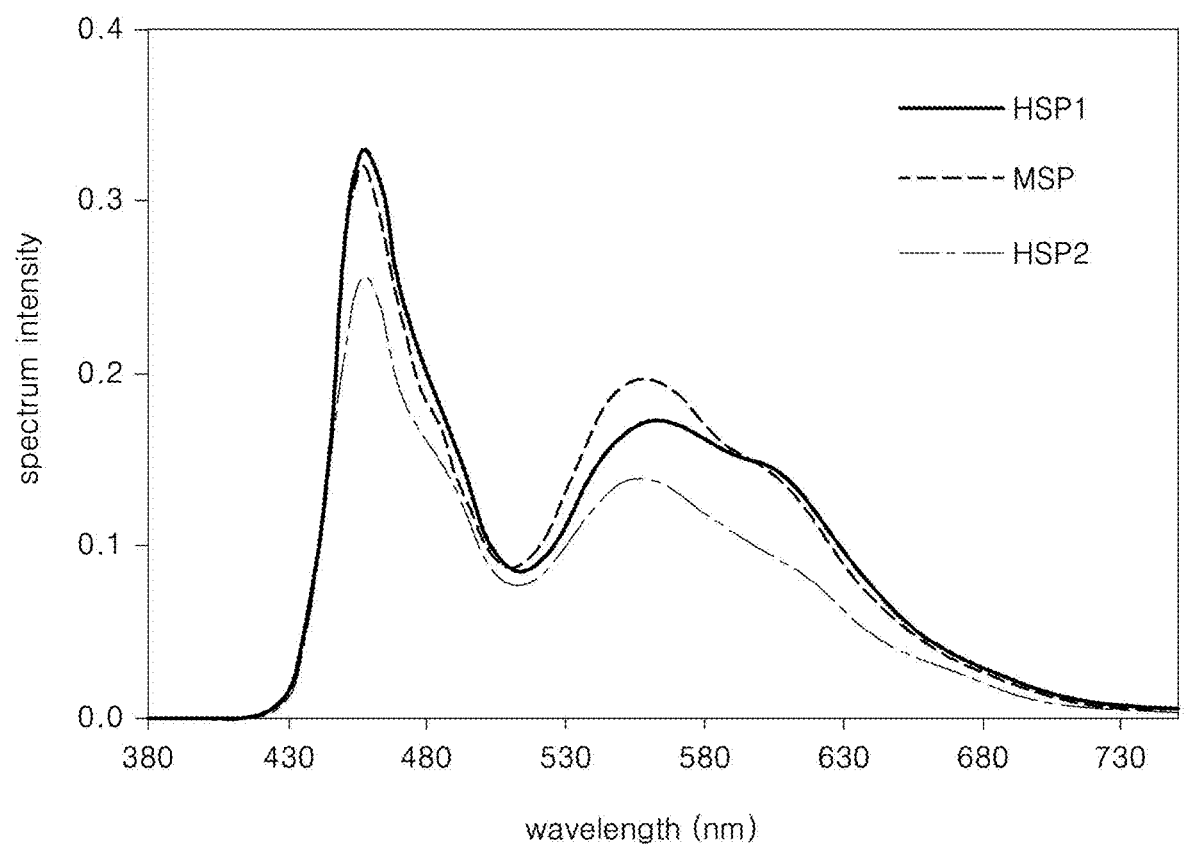
FIG. 7B is a graph illustrating optical spectra of a main subpixel, a first auxiliary subpixel, and a second auxiliary subpixel according to the modified example of the electroluminescent device according to the second embodiment of the present disclosure.

FIG. 7A is a plan view schematically illustrating a modified example of the subpixel of the electroluminescent device according to the second embodiment of the present disclosure, and FIG. 7B is a graph illustrating optical spectra of a main subpixel, a first auxiliary subpixel, and a second auxiliary subpixel according to the modified example of the electroluminescent device according to the second embodiment of the present disclosure.

As illustrated in FIG. 7A, a single subpixel SP of the modified example may include a main subpixel MSP, a first auxiliary subpixel HSP1, and a second auxiliary subpixel HSP2.

Here, each of the main subpixel MSP, the first auxiliary subpixel HSP1, and the second auxiliary subpixel HSP2 may correspond to an emissive area.

An area other than the main subpixel MSP, the first auxiliary subpixel HSP1, and the second auxiliary subpixel HSP2 may be a non-emissive area.

In this case, although the main subpixel MSP, the first auxiliary subpixel HSP1, and the second auxiliary subpixel HSP2 are each illustrated as having a quadrilateral shape in plan view, embodiments are not limited thereto.

That is, the main subpixel MSP, the first auxiliary subpixel HSP1, and the second auxiliary subpixel HSP2 may also have a circular shape or a polygonal shape, such as a triangular shape or a pentagonal shape in plan view.

Particularly, micro lenses ML1, ML2, and ML3, which differ from each other, may be formed in the main subpixel MSP, the first auxiliary subpixel HSP1, and the second auxiliary subpixel HSP2, respectively.

That is, a first micro lens ML1 may be disposed in the main subpixel MSP, a second micro lens ML2, which differs from the first micro lens ML1, may be disposed at the first auxiliary subpixel HSP1, and a third micro lens ML3, which differs from the first and second micro lenses ML1 and ML2, may be disposed at the second auxiliary subpixel HSP2.

Here, although the first, second, and third micro lenses ML1, ML2, and ML3 are illustrated as having a hexagonal shape in plan view, embodiments are not limited thereto, and the first, second, and third micro lenses ML1, ML2, and ML3 may have various other shapes, such as a circular shape and an elliptical shape, in plan view.

As illustrated in FIG. 7B, in the modified example of an electroluminescent device 200 of FIG. 5 according to the second embodiment of the present disclosure, the main subpixel MSP, the first auxiliary subpixel HSP1, and the second auxiliary subpixel HSP2 have different optical spectra.

That is, the main subpixel MSP, the first auxiliary subpixel HSP1, and the second auxiliary subpixel HSP2 listed in order of highest to lowest spectrum intensity at 460 nm, which is in the blue wavelength range, may be the first auxiliary subpixel HSP1, the main subpixel MSP, and the second auxiliary subpixel HSP2 (HSP1>MSP>HSP2).

Also, the main subpixel MSP, the first auxiliary subpixel HSP1, and the second auxiliary subpixel HSP2 listed in order of highest to lowest spectrum intensity at 560 nm, which is in the green wavelength range, may be the main subpixel MSP, the first auxiliary subpixel HSP1, and the second auxiliary subpixel HSP2 (MSP>HSP1>HSP2).

In addition, the main subpixel MSP, the first auxiliary subpixel HSP1, and the second auxiliary subpixel HSP2 listed in order of highest to lowest spectrum intensity at 650 nm, which is in the red wavelength range, may be the first auxiliary subpixel HSP1, the main subpixel MSP, and the second auxiliary subpixel HSP2 (HSP1>MSP>HSP2).

As described above, the single subpixel SP includes the main subpixel MSP, the first auxiliary subpixel HSP1, and the second auxiliary subpixel HSP2, and each of the main subpixel MSP, the first auxiliary subpixel HSP1, and the second auxiliary subpixel HSP2 has a corresponding driving thin film transistor and thus can be driven independently and separately.

Accordingly, the color temperature may be increased by driving the main subpixel MSP and the first auxiliary subpixel HSP1, and the color temperature may be decreased by driving the main subpixel MSP and the second auxiliary subpixel HSP2.

Further, the color temperature of the electroluminescent device may be varied by adjusting a voltage applied to each of the first and second auxiliary subpixels HSP1 and HSP2.

Third Embodiment

Hereinafter, detailed description of configurations identical or similar to those of the first embodiment may be omitted.

Figure 8:
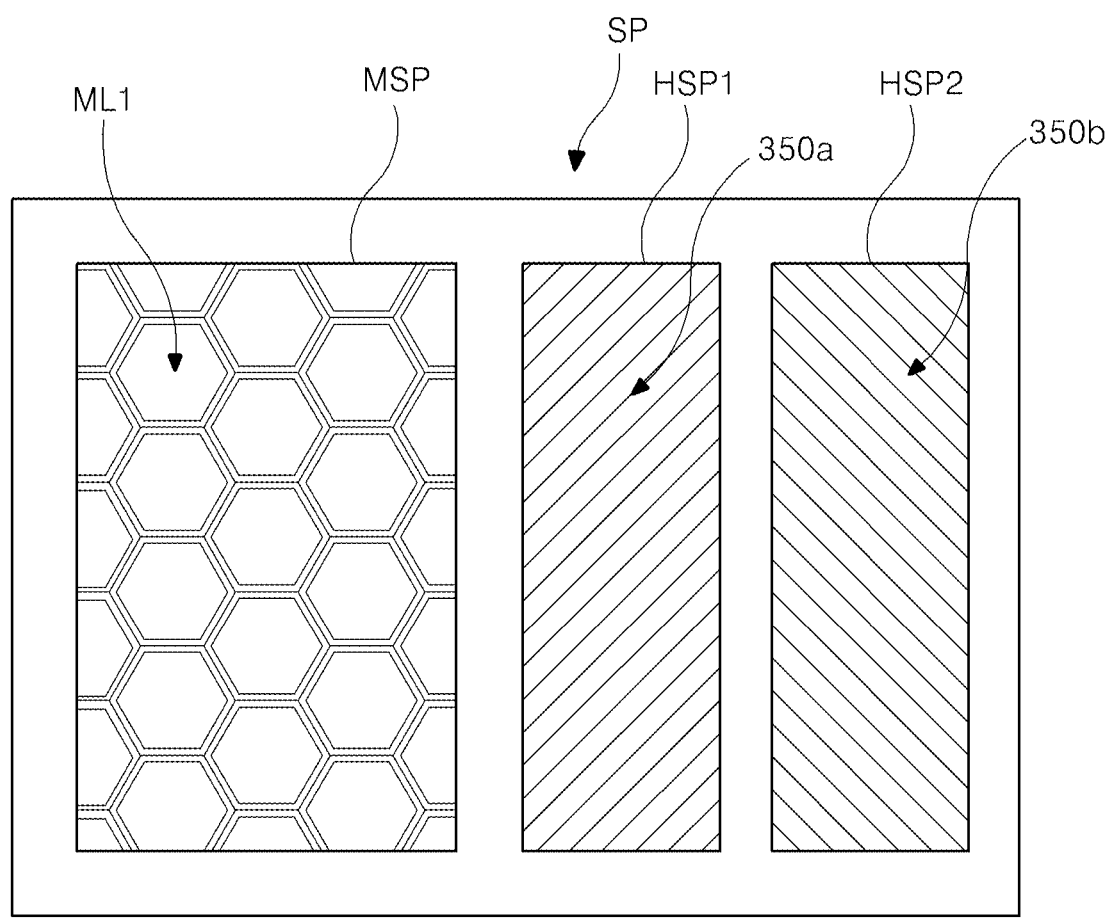
FIG. 8 is a plan view schematically illustrating a subpixel of an electroluminescent device according to a third embodiment of the present disclosure.
Figure 9:
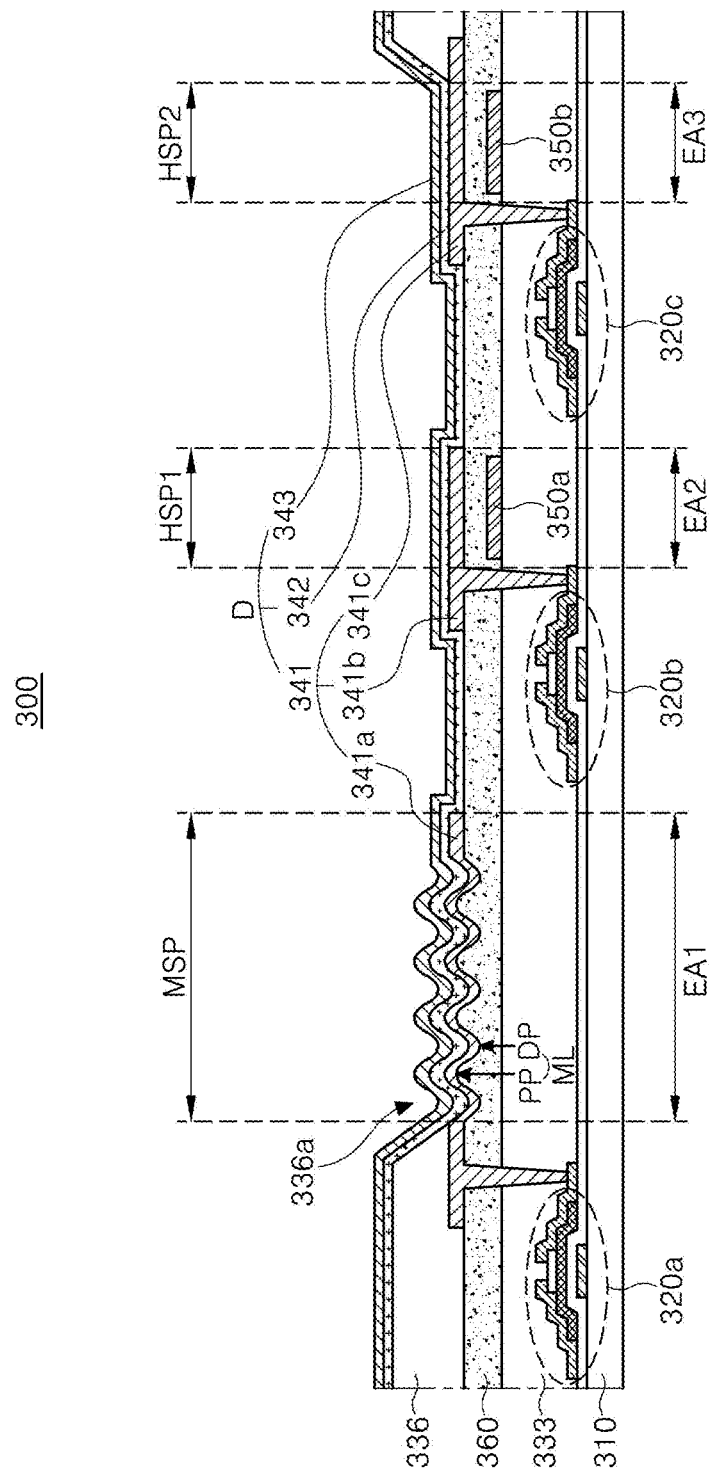
FIG. 9 is a cross-sectional view schematically illustrating the subpixel of the electroluminescent device according to the third embodiment of the present disclosure.

FIG. 8 is a plan view schematically illustrating a subpixel of an electroluminescent device according to a third embodiment of the present disclosure, and FIG. 9 is a cross-sectional view schematically illustrating the subpixel of the electroluminescent device according to the third embodiment of the present disclosure.

As illustrated in FIG. 8, a single subpixel SP of the electroluminescent device according to the third embodiment of the present disclosure includes a main subpixel MSP, a first auxiliary subpixel HSP1, and a second auxiliary subpixel HSP2.

Here, the main subpixel MSP, the first auxiliary subpixel HSP1, and the second auxiliary subpixel HSP2 may correspond to emissive areas.

An area other than the main subpixel MSP, the first auxiliary subpixel HSP1, and the second auxiliary subpixel HSP2 may be a non-emissive area.

Here, although the main subpixel MSP, the first auxiliary subpixel HSP1, and the second auxiliary subpixel HSP2 are each illustrated as having a quadrilateral shape in plan view, embodiments are not limited thereto.

That is, the main subpixel MSP, the first auxiliary subpixel HSP1, and the second auxiliary subpixel HSP2 may also have a circular shape or a polygonal shape, such as a triangular shape or a pentagonal shape in plan view.

Particularly, a micro lens ML may be formed in the main subpixel MSP.

That is, a micro lens ML which has a hexagonal shape in plan view may be formed in the main subpixel MSP. However, embodiments are not limited thereto, and the micro lens ML may have various other shapes, such as a circular shape and an elliptical shape, in plan view.

First and second optical filters 350a and 350b may be disposed in the first auxiliary subpixel HSP1 and the second auxiliary subpixel HSP2, respectively.

That is, the first optical filter 350a may be disposed in the first auxiliary subpixel HSP1, and the second optical filter 350b may be disposed in the second auxiliary subpixel HSP2.

As illustrated in FIG. 9, an electroluminescent device 300 according to the third embodiment of the present disclosure includes a substrate 310, a first thin film transistor 320a, a second thin film transistor 320b, a third thin film transistor 320c, an overcoat layer 360, and a light-emitting diode D electrically connected to the first thin film transistor 320a, the second thin film transistor 320b, and the third thin film transistor 320c.

The first thin film transistor 320a, the second thin film transistor 320b, and the third thin film transistor 320c may be disposed on the substrate 310.

That is, the first thin film transistor 320a, the second thin film transistor 320b, and the third thin film transistor 320c may be disposed in the subpixel SP.

A passivation layer 333 may be disposed on the first thin film transistor 320a, the second thin film transistor 320b, and the third thin film transistor 320c.

The overcoat layer 360 may be disposed on the passivation layer 333.

The present disclosure may include one or more subpixels. Also, two to four subpixels SP may form a single pixel.

Here, the subpixel SP refers to a unit in which the light-emitting diode D is capable of emitting a particular color.

Particularly, the subpixel SP of the electroluminescent device 300 according to the third embodiment of the present disclosure may include the main subpixel MSP, the first auxiliary subpixel HSP1, and the second auxiliary subpixel HSP2.

The main subpixel MSP may correspond to a first emissive area EA1, the first auxiliary subpixel HSP1 may correspond to a second emissive area EA2, and the second auxiliary subpixel HSP2 may correspond to a third emissive area EA3.

Here, the first, second, and third emissive areas EA1, EA2, and EA3 refer to areas in which a light-emitting layer 342 emits light due to a bottom electrode 341 and a top electrode 343.

That is, an area in which the light-emitting layer 342 emits light due to a first bottom electrode 341a and the top electrode 343 may be defined as the first emissive area EA1, an area in which the light-emitting layer 342 emits light due to a second bottom electrode 341b and the top electrode 343 may be defined as the second emissive area EA2, and an area in which the light-emitting layer 342 emits light due to a third bottom electrode 341c and the top electrode 343 may be defined as the third emissive area EA3.

Therefore, three emissive areas EA1, EA2, and EA3 may be disposed in the single subpixel SP in the electroluminescent device 300 according to the third embodiment of the present disclosure.

Additionally, to improve the light extraction efficiency, the electroluminescent device 300 according to the third embodiment of the present disclosure may include the micro lens ML formed in the overcoat layer 360 corresponding to the main subpixel MSP.

Here, the micro lens ML may include a plurality of depressed portions DP and a plurality of protruding portions PP, but embodiments are not limited thereto, and the micro lens ML may have various other forms.

For example, a micro lens ML, which includes protruding portions PP and connecting portions configured to connect adjacent protruding portions PP, may be formed in the overcoat layer 360.

In an area in which the plurality of depressed portions DP and the plurality of protruding portions PP are not disposed, the overcoat layer 360 serves as a planarization layer. That is, in an area other than the main subpixel MSP, the overcoat layer 360 may have a flat top surface.

Here, each of the plurality of depressed portions DP may have various shapes, such as a hexagonal shape, a semicircular shape, a semi-elliptical shape, and a quadrilateral shape, in plan view.

The light-emitting diode D which includes the bottom electrode 341, the light-emitting layer 342, and the top electrode 343 may be disposed on the overcoat layer 360.

Here, the bottom electrode 341 may be an anode or cathode for supplying electrons or holes to the light-emitting layer 342.

A case in which the bottom electrode 341 of the electroluminescent device 300 according to the third embodiment of the present disclosure is an anode will be described as an example.

The bottom electrode 341 may be formed of a conductive material having relatively high work function. For example, the bottom electrode 341 may be formed of a transparent conductive material such as ITO and IZO.

Particularly, the bottom electrode 341 of the electroluminescent device 300 according to the third embodiment of the present disclosure may include the first bottom electrode 341a, the second bottom electrode 341b, and the third bottom electrode 341c.

The first bottom electrode 341a, the second bottom electrode 341b, and the third bottom electrode 341c may be separately formed for the main subpixel MSP, the first auxiliary subpixel HSP1, and the second auxiliary subpixel HSP2, respectively.

For example, the first bottom electrode 341a may be disposed in the main subpixel MSP, the second bottom electrode 341b may be disposed at the first auxiliary subpixel HSP1, and the third bottom electrode 341c may be disposed at the second auxiliary subpixel HSP2.

In addition, the first bottom electrode 341a, the second bottom electrode 341b, and the third bottom electrode 341c may be connected to the first thin film transistor 320a, the second thin film transistor 320b, and the third thin film transistor 320c, respectively.

For example, the first bottom electrode 341a may be connected to the first thin film transistor 320a through a first contact hole formed in the overcoat layer 360, the second bottom electrode 341b may be connected to the second thin film transistor 320b through a second contact hole formed in the overcoat layer 360, and the third bottom electrode 341c may be connected to the third thin film transistor 320c through a third contact hole formed in the overcoat layer 360. The first, second and third contact holes may also be formed in the passivation layer 333.

Here, the first bottom electrode 341a, the second bottom electrode 341b, and the third bottom electrode 341c may be disposed in a shape that follows the morphology of the surface of the overcoat layer 360.

That is, the first bottom electrode 341a may be disposed in a form which follows the morphology of the plurality of depressed portions DP and the plurality of protruding portions PP of the overcoat layer 360 exactly, and the second bottom electrode 341b and the third bottom electrode 341c may be disposed in a form which has a flat top surface.

Particularly, in the electroluminescent device 300 according to the third embodiment of the present disclosure, the optical filters 350a and 350b may be disposed in the first auxiliary subpixel HSP1 and the second auxiliary subpixel HSP2, respectively.

That is, the optical filters 350a and 350b may be disposed under the second bottom electrode 341b and the third bottom electrode 341c, respectively.

For example, the first optical filter 350a configured to transmit only a specific wavelength may be disposed under the second bottom electrode 341b, and the second optical filter 350b configured to transmit only a specific wavelength may be disposed under the third bottom electrode 341c.

The first optical filter 350a and the second optical filter 350b may transmit different wavelengths, but embodiments are not limited thereto. Alternatively, the first optical filter and the second optical filter may transmit the same wavelength.

In addition, the first optical filter 350a may be disposed at a position which corresponds to the second emissive area EA2, and the second optical filter 350b may be disposed at a position which corresponds to the third emissive area EA3.

Here, the first optical filter 350a may also be formed in a portion of the second emissive area EA2, and the second optical filter 350b may also be formed in a portion of the third emissive area EA3.

Also, the first and second optical filters 350a and 350b may be disposed between the passivation layer 333 and the overcoat layer 360, but embodiments are not limited thereto.

Here, the first and second optical filters 350a and 350b may be formed of a color filter pattern or a quantum dot.

The color filter pattern may be one of a red color filter pattern, a green color filter pattern, and a blue color filter pattern.

The quantum dot may be selected from a II-VI group compound, a III-V group compound, a IV-VI group compound, an IV group element, a IV group compound, and a combination thereof.

The II-VI group compound may be selected from the group consisting of a two-element compound selected from the group consisting of CdSe, CdTe, ZnS, ZnSe, ZnTe, ZnO, HgS, HgSe, HgTe, MgSe, MgS and a mixture thereof; a three-element compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a mixture thereof; and a four-element compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and a mixture thereof.

The III-V group compound may be selected from the group consisting of a two-element compound selected from the group consisting of GaN, GaP, GaAs, GaSb, AlN, AlP, AlAs, AlSb, InN, InP, InAs, InSb and a mixture thereof; a three-element compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP and a mixture thereof; and a four-element compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a mixture thereof.

The IV-VI group compound may be selected from the group consisting of a two-element compound selected from the group consisting of SnS, SnSe, SnTe, PbS, PbSe, PbTe and a mixture thereof; a three-element compound selected from the group consisting of SnSeS, SnSeTe, SnSTe, PbSeS, PbSeTe, PbSTe, SnPbS, SnPbSe, SnPbTe and a mixture thereof; and a four-element compound selected from the group consisting of SnPbSSe, SnPbSeTe, SnPbSTe and a mixture thereof.

The IV group element may be selected from the group consisting of Si, Ge, and a mixture thereof.

The IV group compound may be a two-element compound selected from the group consisting of SiC, SiGe, and a mixture thereof.

At this time, the two-element compound, the three-element compound, or the four-element compound may be present at a uniform concentration in a particle or present at different concentrations within the same particle.

A core/shell structure in which a single quantum dot surrounds another quantum dot may be provided. At this time, an interface between the core and the shell may have a concentration gradient, in which a concentration of an element present in the shell gradually decreases toward the center.

A bank layer 336 may be disposed on the overcoat layer 360 and the bottom electrode 341.

The bank layer 336 may include an opening 336a which exposes the bottom electrode 341.

Here, the bank layer 336 may be disposed between adjacent pixel (or subpixel) areas and serve to differentiate the adjacent pixel (or subpixel) areas.

Here, the main subpixel MSP, the first auxiliary subpixel HSP1, and the second auxiliary subpixel HSP2 may be disposed in the opening 336a of the bank layer 336.

Also, the light-emitting layer 342 may be disposed on the exposed first bottom electrode 341a, second bottom electrode 341b, and third bottom electrode 341c.

Here, the light-emitting layer 342 may emit white light.

For example, the light-emitting layer 342 may have a tandem white structure in which a plurality of light-emitting layers is stacked, but embodiments are not limited thereto.

When the light-emitting layer 342 has the tandem white structure in which a plurality of light-emitting layers is stacked, the light-emitting layer 342 may include a first light-emitting layer configured to emit blue light and a second light-emitting layer disposed on the first light-emitting layer and configured to emit light having color which turns white when mixed with blue. The second light-emitting layer may be a light-emitting layer configured to emit yellow-green light.

Meanwhile, the light-emitting layer 342 may include only light-emitting layers that emit one of blue light, red light, and green light.

Here, a luminescent material of the light-emitting layer 342 may be an organic luminescent material or an inorganic luminescent material such as a quantum dot.

Also, the light-emitting layer 342 may have a shape which follows the morphology of the overcoat layer 360.

That is, the light-emitting layer 342 may be disposed in a form which follows the morphology of the plurality of depressed portions DP and the plurality of protruding portions PP of the overcoat layer 360 in the main subpixel MSP exactly and disposed in a form which has a flat top surface in the first auxiliary subpixel HSP1 and the second auxiliary subpixel HSP2.

The top electrode 343 for supplying one of electrons or holes to the light-emitting layer 342 may be disposed on the light-emitting layer 342.

Here, the top electrode 343 may be an anode or a cathode.

A case in which the top electrode 343 of the electroluminescent device 300 according to the third embodiment of the present disclosure is a cathode will be described as an example.

The top electrode 343 may be formed of a conductive material having relatively low work function and may be located on a substantially entire surface of a display area.

For example, the top electrode 343 may be formed of Al, Mg, Ag, or an alloy thereof, but embodiments are not limited thereto.

Here, the top electrode 343 may have a shape which follows the morphology of the overcoat layer 360.

That is, the top electrode 343 may be disposed in the form which follows the morphology of the plurality of depressed portions DP and the plurality of protruding portions PP of the overcoat layer 360 in the main subpixel MSP exactly and disposed in a form which has a flat top surface in the first auxiliary subpixel HSP1 and the second auxiliary subpixel HSP2.

The above-described first bottom electrode 341a, second bottom electrode 341b, third bottom electrode 341c, light-emitting layer 342, and top electrode 343 constitute the light-emitting diode D.

Particularly, the light-emitting diode D of the electroluminescent device 300 according to the third embodiment of the present disclosure may be disposed in the form which follows the morphology of the plurality of depressed portions DP and the plurality of protruding portions PP of the overcoat layer 360 in the main subpixel MSP exactly and disposed in the form which has a flat top surface in the first auxiliary subpixel HSP1 and the second auxiliary subpixel HSP2.

Also, the first optical filter configured to transmit only a specific wavelength may be disposed in the first auxiliary subpixel HSP1, and the second optical filter configured to transmit only a specific wavelength may be disposed in the second auxiliary subpixel HSP2.

Accordingly, the main subpixel MSP, the first auxiliary subpixel HSP1, and the second auxiliary subpixel HSP having different color temperatures may be realized in the single subpixel SP.

Meanwhile, in the third embodiment of the present disclosure, although the structure in which the micro lens ML is formed in the main subpixel MSP and the optical filters 350a and 350b are disposed in the first auxiliary subpixel HSP1 and the second auxiliary subpixel HSP2, respectively, has been described, the structure is merely an example, and embodiments are not limited thereto.

For example, a micro lens ML may be formed in any one or each of the first auxiliary subpixel HSP1 and the second auxiliary subpixel HSP2, and the optical filters 350a and 350b may also be disposed in any one or each of the first auxiliary subpixel HSP1 and the second auxiliary subpixel HSP2.

Figure 10A:
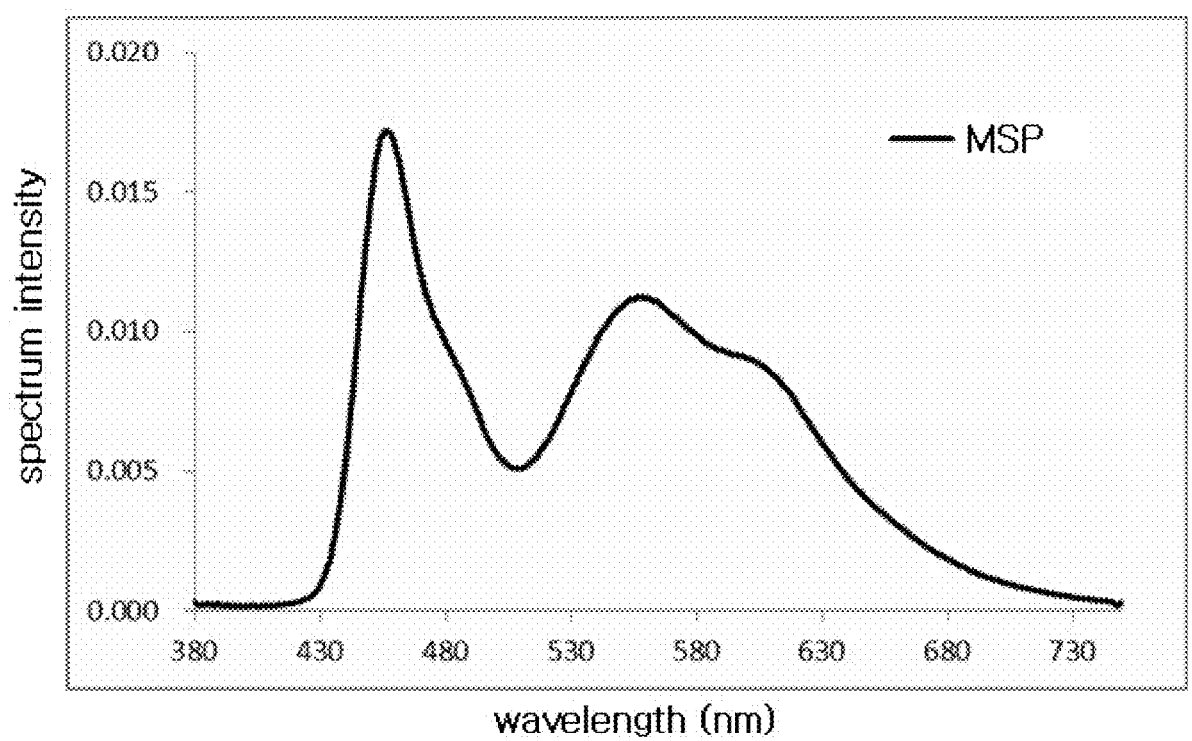
FIG. 10A is a graph illustrating an optical spectrum of a main subpixel of the electroluminescent device according to the third embodiment of the present disclosure.
Figure 10B:
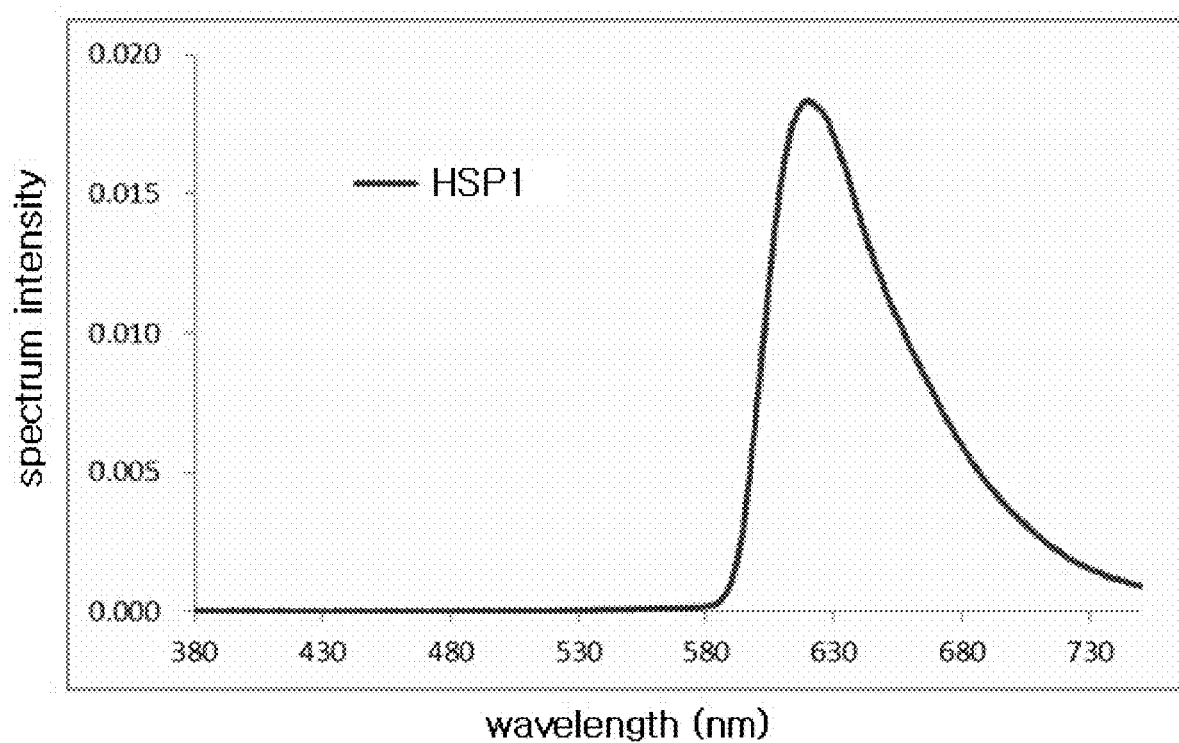
FIG. 10B is a graph illustrating an optical spectrum of a first auxiliary subpixel of the electroluminescent device according to the third embodiment of the present disclosure.
Figure 10C:
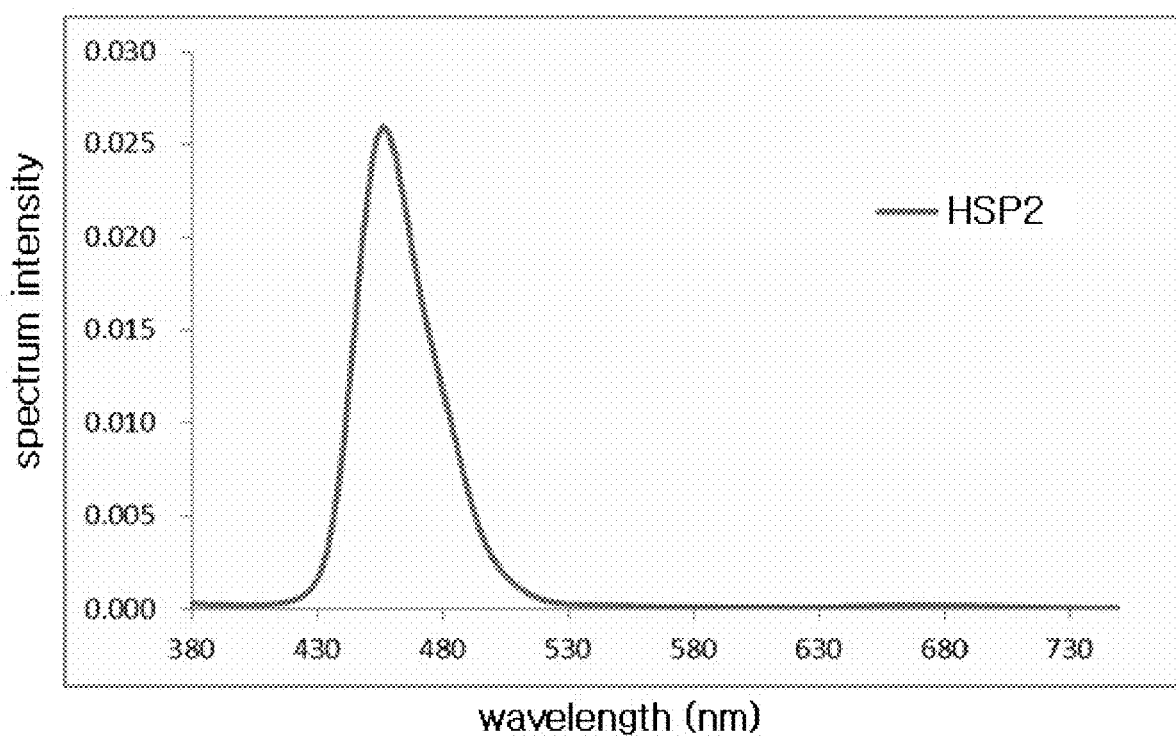
FIG. 10C is a graph illustrating an optical spectrum of a second auxiliary subpixel of the electroluminescent device according to the third embodiment of the present disclosure.
Figure 11A:
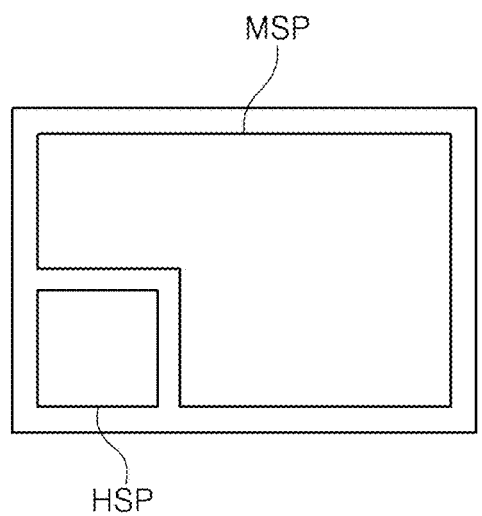
FIGS. 11A to 11K are plan views schematically illustrating modified examples of a main subpixel and an auxiliary subpixel disposed in a subpixel of an electroluminescent device according to an embodiment of the present disclosure.
Figure 11B:
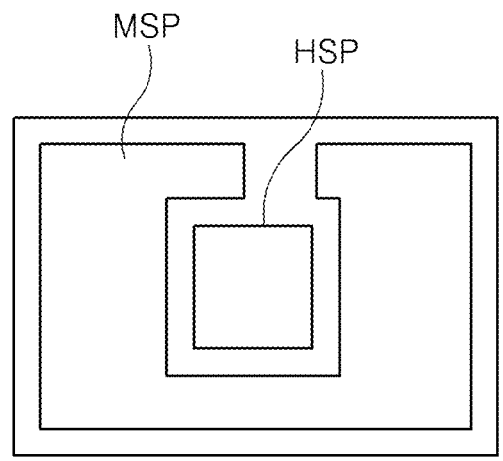
Figure 11C:
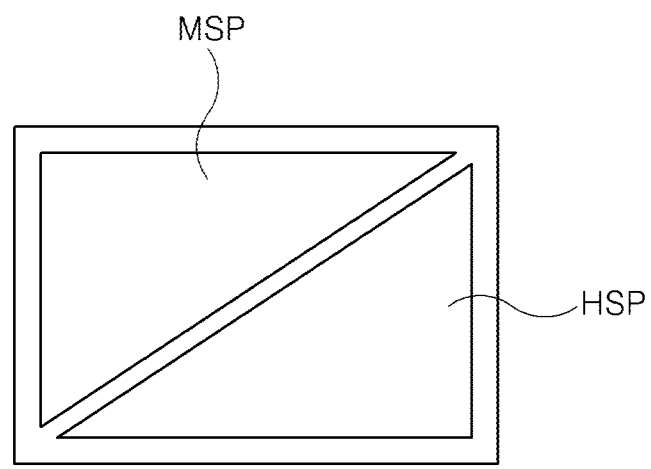
Figure 11D:
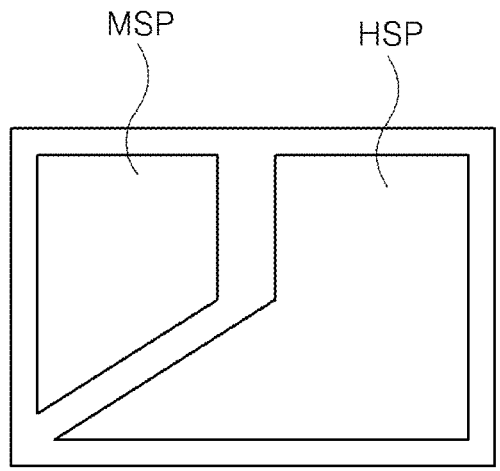
Figure 11E:
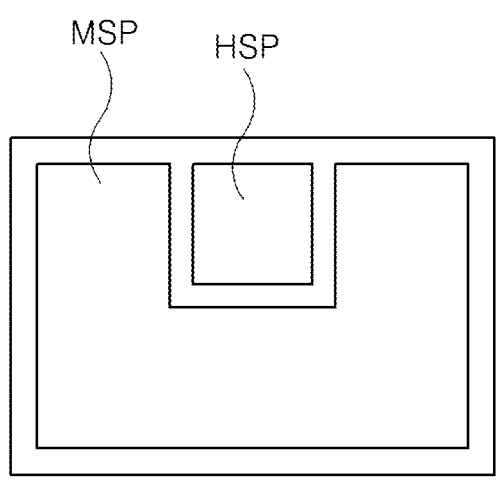
Figure 11F:
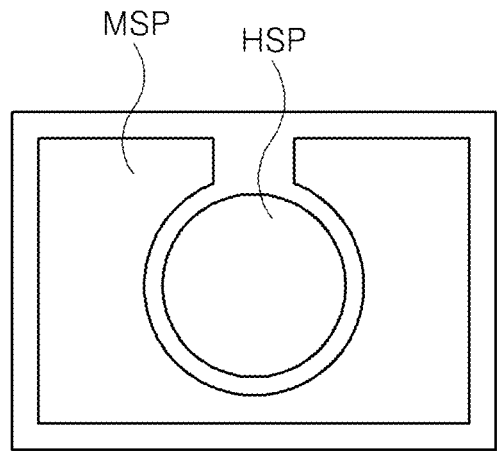
Figure 11G:
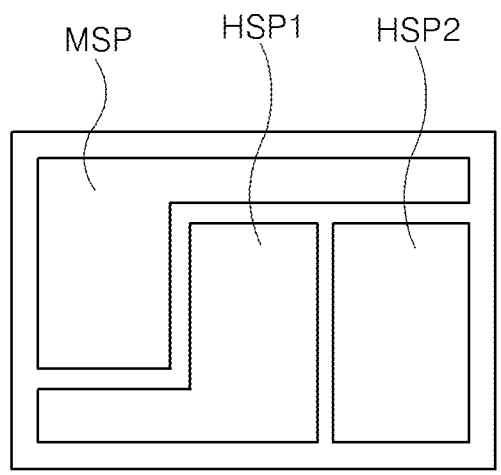
Figure 11H:
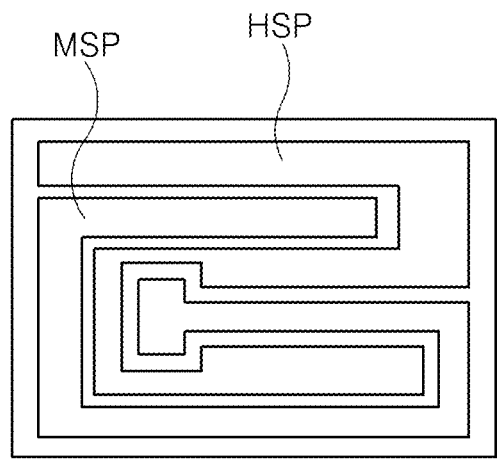
Figure 11I:
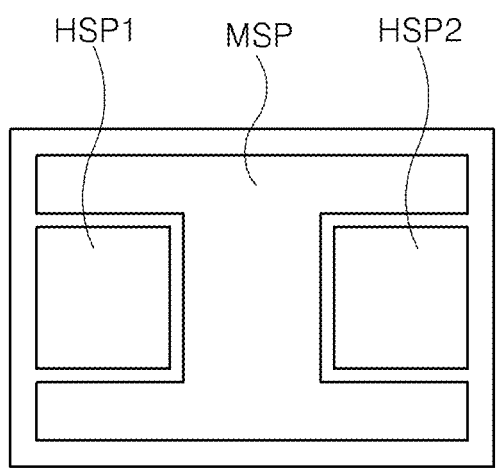
Figure 11J:
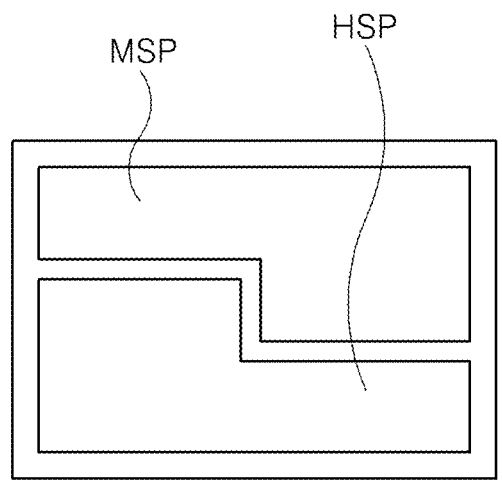
Figure 11K:
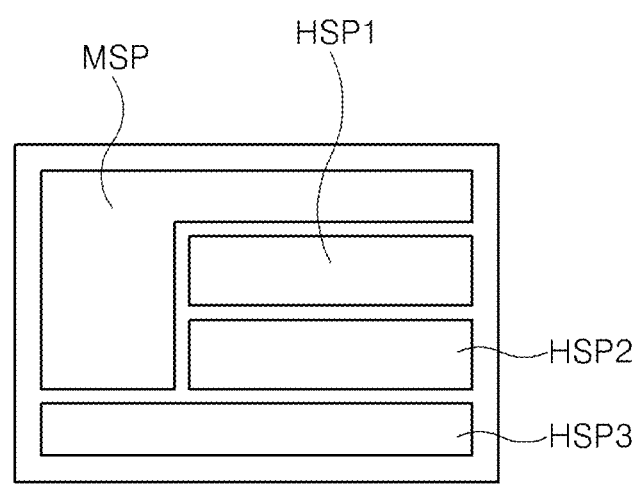

FIG. 10A is a graph illustrating an optical spectrum of a main subpixel of the electroluminescent device according to the third embodiment of the present disclosure, FIG. 10B is a graph illustrating an optical spectrum of a first auxiliary subpixel of the electroluminescent device according to the third embodiment of the present disclosure, and FIG. 10C is a graph illustrating an optical spectrum of a second auxiliary subpixel of the electroluminescent device according to the third embodiment of the present disclosure.

As illustrated in FIGS. 10A to 10C, the main subpixel MSP, the first auxiliary subpixel HSP1, and the second auxiliary subpixel HSP2 of the electroluminescent device 300 according to the third embodiment of the present disclosure have different optical spectra from each other.

That is, it can be seen that, unlike the main subpixel MSP, the first auxiliary subpixel HSP1 and the second auxiliary subpixel HSP2 transmit only light in a specific wavelength range.

For example, the first auxiliary subpixel HSP1 may transmit only light in the red wavelength range, and the second auxiliary subpixel HSP2 may transmit only light in the blue wavelength range.

Accordingly, since the main subpixel MSP, the first auxiliary subpixel HSP1, and the second auxiliary subpixel HSP2 may be driven independently, the color temperature may be decreased by driving the main subpixel MSP and the first auxiliary subpixel HSP1, and the color temperature may be increased by driving the main subpixel MSP and the second auxiliary subpixel HSP2.

Further, the color temperature of the electroluminescent device 300 of FIG. 9 may be varied by adjusting a voltage applied to each of the first and second auxiliary subpixels HSP1 and HSP2.

As described above, the overcoat layer 360 including the micro lens ML, which is formed of the plurality of depressed portions DP and the plurality of protruding portions PP, is disposed in the main subpixel MSP in the electroluminescent device 300 according to the third embodiment of the present disclosure. Accordingly, light, which has not been extracted to the outside due to total reflection of the light emitted from the light-emitting layer 342 inside the first bottom electrode 341a and the light-emitting layer 342, may be made to travel at an angle which is smaller than a total reflection critical angle. Therefore, external luminous efficiency may be improved through multiple reflections.

Further, by arranging the first auxiliary subpixel HSP1 and the second auxiliary subpixel HSP2 having different color temperatures due to the optical filters 350a and 350b which transmit only light in a specific wavelength range, the color temperature of the electroluminescent device 300 may be varied.

FIGS. 11A to 11K are plan views schematically illustrating modified examples of a main subpixel and an auxiliary subpixel disposed in a subpixel of an electroluminescent device according to an embodiment of the present disclosure.

As illustrated in FIGS. 11A to 11K, a main subpixel MSP and an auxiliary subpixel HSP of the electroluminescent device according to the embodiment of the present disclosure may have a circular shape or a polygonal shape, such as a triangular shape or a pentagonal shape in plan view.

In addition, a plurality of auxiliary subpixels HSP may be disposed.

Also, areas of the main subpixel MSP and the auxiliary subpixel HSP may be equal to or different from each other.

That is, the electroluminescent device according to the embodiment of the present disclosure may have various forms and arrangement structures as long as a main subpixel and an auxiliary subpixel having different color temperatures are disposed in a single subpixel.

In the present disclosure, a first micro lens is disposed in a main subpixel, an auxiliary subpixel is made to have a color temperature which differs from that of the main subpixel, and the main subpixel and the auxiliary subpixel are driven independently so that a color temperature can be adjusted while the light extraction efficiency is improved.

It will be apparent to those skilled in the art that various modifications and variations can be made in the electroluminescent device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An electroluminescent device, comprising:
   a substrate including a plurality of subpixels, a single subpixel of the plurality of subpixels being divided into:
      a main subpixel; and
      an auxiliary subpixel;
   a first thin film transistor and a second thin film transistor disposed on the substrate, the first thin film transistor corresponding to the main subpixel and the second thin film transistor corresponding to the auxiliary subpixel;
   an overcoat layer on the first and second thin film transistors;
   a bank layer on the overcoat layer, the bank layer including an opening exposing the first and second bottom electrodes;
   a first bottom electrode and a second bottom electrode on the overcoat layer, the first bottom electrode corresponding to the main subpixel and the second bottom electrode corresponding to the auxiliary subpixel;
   a light-emitting layer on the first bottom electrode and the second bottom electrode; and
   a top electrode on the light-emitting layer,
   wherein the main subpixel and the auxiliary subpixel have different color temperatures, and
   wherein the main subpixel and the auxiliary subpixel are independently and separately driven by the first and second thin film transistors, respectively.

2. The electroluminescent device of claim 1, wherein:
   the overcoat layer includes a first micro lens including a plurality of first depressed portions and a plurality of first protruding portions in the main subpixel; and
   the first bottom electrode, the light-emitting layer, and the top electrode follow a morphology of the first micro lens in the main subpixel.

3. The electroluminescent device of claim 2, wherein:
   the overcoat layer has a flat morphology in the auxiliary subpixel; and
   the second bottom electrode, the light-emitting layer, and the top electrode follow the flat morphology of the overcoat layer in the auxiliary subpixel.

4. The electroluminescent device of claim 3, wherein a color filter pattern outputting light in a specific wavelength range is disposed between the second bottom electrode and the substrate.

5. The electroluminescent device of claim 3, wherein a quantum dot outputting light in a specific wavelength range is disposed between the second bottom electrode and the substrate.

6. The electroluminescent device of claim 2, wherein:
   the overcoat layer further includes a second micro lens including a plurality of second depressed portions and a plurality of second protruding portions different from the first micro lens in the auxiliary subpixel; and
   the second bottom electrode, the light-emitting layer, and the top electrode follow a morphology of the second micro lens in the auxiliary subpixel.

7. The electroluminescent device of claim 6, wherein each of the plurality of second protruding portions has:
   a height in a range of 0.6 μm to 0.85 μm; and
   a width in a range of 4.1 μm to 4.3 μm.

8. The electroluminescent device of claim 2, wherein each of the plurality of first protruding portions has:
   a height in a range of 0.9 μm to 1 μm; and
   a width in a range of 4.4 μm to 4.6 μm.

9. The electroluminescent device of claim 1, wherein a passivation layer having an insulating property is disposed between the overcoat layer and the first and second bottom electrodes.

10. The electroluminescent device of claim 1, wherein the main subpixel and the auxiliary subpixel are disposed in the opening of the bank layer.

11. The electroluminescent device of claim 1, wherein the bank layer is disposed between two adjacent subpixels of the plurality of subpixels to differentiate the two adjacent subpixels.

12. The electroluminescent device of claim 1, wherein the first and second bottom electrodes are disposed directly on the overcoat layer.

13. The electroluminescent device of claim 1, wherein the light-emitting layer contacts the overcoat layer exposed between the first and second bottom electrodes.

* * * * *